US012785656B2

(12) United States Patent
Kojo

(10) Patent No.: US 12,785,656 B2
(45) Date of Patent: Nov. 3, 2026

(54) PIEZOELECTRIC RESONATOR DEVICE

(71) Applicant: DAISHINKU CORPORATION, Kakogawa (JP)

(72) Inventor: Takuya Kojo, Kakogawa (JP)

(73) Assignee: DAISHINKU CORPORATION, Kakogawa (JP)

( * ) Notice: Subject to any disclaimer, the term of this patent is extended or adjusted under 35 U.S.C. 154(b) by 721 days.

(21) Appl. No.: 18/270,991

(22) PCT Filed: Dec. 28, 2021

(86) PCT No.: PCT/JP2021/048747
§ 371 (c)(1),
(2) Date: Jul. 5, 2023

(87) PCT Pub. No.: WO2022/149541
PCT Pub. Date: Jul. 14, 2022

(65) Prior Publication Data
US 2024/0305269 A1 Sep. 12, 2024

(30) Foreign Application Priority Data
Jan. 8, 2021 (JP) ................................ 2021-002000

(51) Int. Cl.
*H03H 9/17* (2006.01)
*H03H 9/10* (2006.01)
*H03H 9/13* (2006.01)

(52) U.S. Cl.
CPC .............. *H03H 9/178* (2013.01); *H03H 9/10* (2013.01); *H03H 9/131* (2013.01)

(58) Field of Classification Search
None
See application file for complete search history.

(56) References Cited

U.S. PATENT DOCUMENTS 5,917,272 A * 6/1999 Clark ........................ H03H 9/08 219/210
6,501,340 B1 * 12/2002 Flood ........................ H03L 1/04 310/318
6,731,180 B1 * 5/2004 Clark ........................ H03L 1/04 310/341
9,468,105 B2 * 10/2016 Kondo ................. H05K 1/0212
10,333,053 B2 * 6/2019 Iizuka .................. H03H 9/1035
11,929,709 B2 * 3/2024 Iizuka ...................... H03B 5/04
2005/0285482 A1 * 12/2005 Oita ......................... H03B 5/32 310/343

(Continued)

FOREIGN PATENT DOCUMENTS

JP 2010283475 A * 12/2010
JP 2015033065 A * 2/2015

(Continued)

*Primary Examiner* — William J Klimowicz
(74) *Attorney, Agent, or Firm* — METROLEX IP LAW GROUP, PLLC; Robert L. Scott, Esq.

(57) ABSTRACT

A piezoelectric resonator device according to one or more embodiments may include at least a core section. The core section includes: a three-ply structured crystal resonator in which a vibrating part is hermetically sealed; and a heater IC as a heating element. At least whole of a second main surface of a second sealing member of the crystal resonator is thermally coupled to the heater IC.

6 Claims, 14 Drawing Sheets

(56) References Cited

U.S. PATENT DOCUMENTS

| | | | | |
|---|---|---|---|---|
| 2016/0204759 | A1* | 7/2016 | Kikushima | H03H 9/1021 310/343 |
| 2016/0322952 | A1* | 11/2016 | Iizuka | H03H 3/02 |
| 2018/0302032 | A1 | 10/2018 | Oya et al. | |
| 2018/0337634 | A1* | 11/2018 | Kondo | H03B 5/32 |
| 2019/0312562 | A1* | 10/2019 | Ishino | H03H 9/19 |
| 2020/0067454 | A1* | 2/2020 | Kikushima | H03B 5/32 |
| 2020/0373906 | A1* | 11/2020 | Yoshioka | H03H 9/0523 |
| 2022/0393643 | A1* | 12/2022 | Iizuka | H03B 5/04 |
| 2023/0014023 | A1* | 1/2023 | Kojo | H03B 5/32 |
| 2024/0056030 | A1* | 2/2024 | Kojo | H03B 5/04 |
| 2024/0120880 | A1* | 4/2024 | Kojo | H03B 5/04 |

FOREIGN PATENT DOCUMENTS

| | | | | |
|---|---|---|---|---|
| JP | 2015080082 | A | * | 4/2015 |
| JP | 2015139053 | A | * | 7/2015 |
| JP | 6376681 | B2 | | 8/2018 |
| JP | 2018-196105 | A | | 12/2018 |

* cited by examiner

PIEZOELECTRIC RESONATOR DEVICE

TECHNICAL FIELD

The present invention relates to piezoelectric devices.

BACKGROUND ART

Recently, in various electronic devices, the operating frequencies have increased and the package sizes (especially, the heights) have decreased. According to such an increase in operating frequency and a reduction in package size, there is also a need for piezoelectric resonator devices (such as a crystal resonator and a crystal oscillator) to be adaptable to the increase in operating frequency and the reduction in package size.

In this kind of piezoelectric resonator devices, a housing is constituted of a package having a substantially rectangular parallelepiped shape. The package is constituted of: a first sealing member and a second sealing member both made of, for example, glass or crystal; and a piezoelectric resonator plate made of, for example, crystal. On respective main surfaces of the piezoelectric resonator plate, excitation electrodes are formed. The first sealing member and the second sealing member are laminated and bonded via the piezoelectric resonator plate. Thus, a vibrating part of the piezoelectric resonator plate, which is disposed in the package (in the internal space), is hermetically sealed.

In a piezoelectric resonator such as a crystal resonator, the vibration frequency changes depending on the temperature according to its frequency temperature characteristics. In order to keep the temperature around the piezoelectric resonator constant, an oven-controlled crystal (Xtal) oscillator (hereinafter also referred to as an "OCXO") is known. It has a configuration in which a piezoelectric resonator is encapsulated in a thermostatic oven (for example, see Patent Document 1).

PRIOR ART DOCUMENT

Patent Document

[Patent Document 1] JP 6376681

SUMMARY OF THE INVENTION

Problem to be Solved by the Invention

In the above-described piezoelectric resonator device, when a piezoelectric resonator and a heating element (e.g. a heater IC and a heater substrate) are disposed separated from each other, there may occur difference in the temperature between the piezoelectric resonator and the heating element, which also may deteriorate accuracy in the temperature adjustment by the OCXO. As a result, the oscillation frequency of the OCXO may be unstable.

The present invention was made in consideration of the above circumstances, an object of which is to provide a piezoelectric resonator device capable of increasing a temperature of a core section rapidly to a target temperature, the core section including: a three-ply structured piezoelectric resonator that hermetically seals a vibrating part; and a heating element.

Means for Solving the Problem

The present invention has a following configuration as means for solving the above problem. That is, a piezoelectric resonator device comprises at least a core section, and the core section includes: a three-ply structured piezoelectric resonator in which a vibrating part is hermetically sealed; and a heating element. At least whole of one main surface of the piezoelectric resonator is thermally coupled to the heating element. An oscillation IC may be mounted on the piezoelectric resonator. In this case, it is preferable that whole of an active surface of the oscillation IC is thermally coupled to the piezoelectric resonator or the heating element.

With the above-described configuration, since at least whole of one main surface of the three-ply structured piezoelectric resonator is thermally coupled to the heating element, it is possible to efficiently heat the piezoelectric resonator. Thus, it is possible to raise the temperature of the core section rapidly to a target temperature, which reduces frequency fluctuation of the piezoelectric resonator device.

In the above-described configuration, it is preferable that a heat capacity of the piezoelectric resonator is smaller than a heat capacity of the heating element. With this configuration, since the heat capacity of the three-ply structured piezoelectric resonator is smaller than the heat capacity of the heating element, it is possible to increase the temperature of the piezoelectric resonator rapidly and thus to reduce the frequency fluctuation of the piezoelectric resonator device.

In the above-described configuration, it is preferable that the core section is mounted inside a package made of an insulating material, and is hermetically sealed in the package by bonding a lid to the package. With this configuration, by mounting the core section inside the package made of the insulating material and hermetically sealing it by the lid, the core section is not exposed to the external environment. Thus, the core section can be maintained at a constant temperature.

In the above-described configuration, it is preferable that the core section includes a substrate that is bonded to the heating element via a bonding material, and that the substrate is made of an insulating material having a thermal conductivity lower than that of the package. With this configuration, since the core section includes the substrate (core substrate) made of the insulating material having a thermal conductivity lower than that of the package, it is possible to prevent heat of the piezoelectric resonator heated by the heating element from being transferred to the package made of ceramic such as alumina as the base material.

In the above-described configuration, it is preferable that the insulating material is crystal, glass, or resin. With this configuration, since the core section includes the substrate (core substrate) made of crystal, glass, or resin, it is possible to prevent heat of the piezoelectric resonator heated by the heating element from being transferred to the package made of ceramic such as alumina as the base material.

In the above-described configuration, it is preferable that the substrate is bonded to the package via a first adhesive. With this configuration, since the substrate (core substrate) made of crystal, glass or resin is bonded to the package via the first adhesive, it is possible to prevent the heat of the core section from being transferred to the package.

In the above-described configuration, it is preferable that the piezoelectric resonator and the heating element are bonded to each other via a second adhesive, and that the second adhesive has a thermal conductivity higher than that of the first adhesive. With this configuration, since the thermal conductivity of the second via is higher than the thermal conductivity of the first conductive adhesive, it is possible to transfer the heat from the heating element efficiently to the piezoelectric resonator before it is transferred to the package.

Effects of the Invention

With the piezoelectric resonator device of the present invention, since at least whole of one main surface of the three-ply structured piezoelectric resonator is thermally coupled to the heating element, it is possible to efficiently heat the piezoelectric resonator. Thus, it is possible to raise the temperature of the core section rapidly to a target temperature, which reduces frequency fluctuation of the piezoelectric resonator device.

MODE FOR CARRYING OUT THE INVENTION

Hereinafter, an embodiment of the present invention will be described with reference to the drawings. In the described embodiment, the present invention is applied to an OCXO (oven-controlled crystal (Xtal) oscillator).

Figure 1:
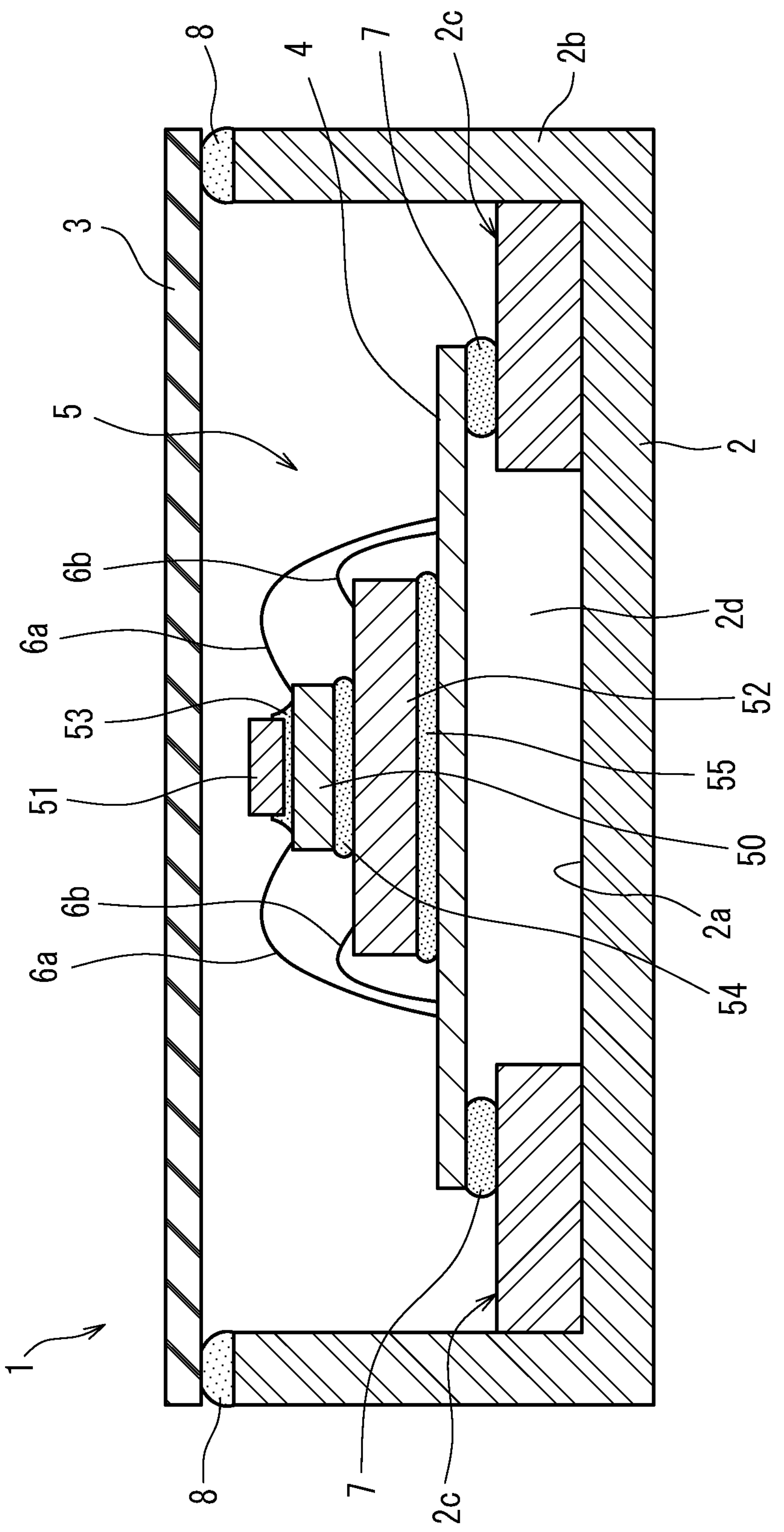
FIG. 1 is a cross-sectional view illustrating a schematic configuration of an OCXO according to an embodiment to which the present invention is applied.

As shown in FIG. 1, an OCXO 1 according to this embodiment has a configuration in which a core section 5 is disposed in a package (housing) 2 made of ceramic or the like and having a substantially rectangular parallelepiped shape such that the core section 5 is hermetically sealed by a lid 3. The package 2 includes a recess part 2*a* whose upper part is opened, and the core section 5 is hermetically encapsulated in the recess part 2*a*. To an upper surface of a peripheral wall part 2*b* that surrounds the recess part 2*a*, the lid 3 is fixed via a sealant 8 by seam welding. Thus, the inside of the package 2 is hermetically sealed (in an airtight state). As the sealant 8, a metal sealant such as Au—Sn alloy or solder is suitably used, however, other sealants including low melting point glass may also be used. The space inside the package 2 is preferably a vacuum atmosphere or an atmosphere with low thermal conductivity with low pressure nitrogen or low pressure argon.

Step parts 2*c* are formed on an inner wall surface of the peripheral wall part 2*b* of the package 2 so as to be along the arrangement of connection terminals (not shown). The core section 5 is connected to the connection terminals formed on the step parts 2*c* via a plate-like core substrate 4. The core substrate 4 is disposed so as to be bridged between a facing pair of step parts 2*c* and 2*c* of the package 2. A space 2*d* is formed under the core substrate 4, between the pair of step parts 2*c* and 2*c*. Connection terminals formed on step surfaces of the step parts 2*c* are connected to connection terminals (not shown) formed on a rear surface 4*b* of the core substrate 4 via a conductive adhesive 7. Also, external terminals (not shown) formed on respective components of the core section 5 are connected to connection terminals 4*c* formed on a front surface 4*a* of the core substrate 4, by wire bonding via wires 6*a* and 6*b*. A polyimide adhesive or an epoxy adhesive is used, for example, as the conductive adhesive 7.

Figure 2:
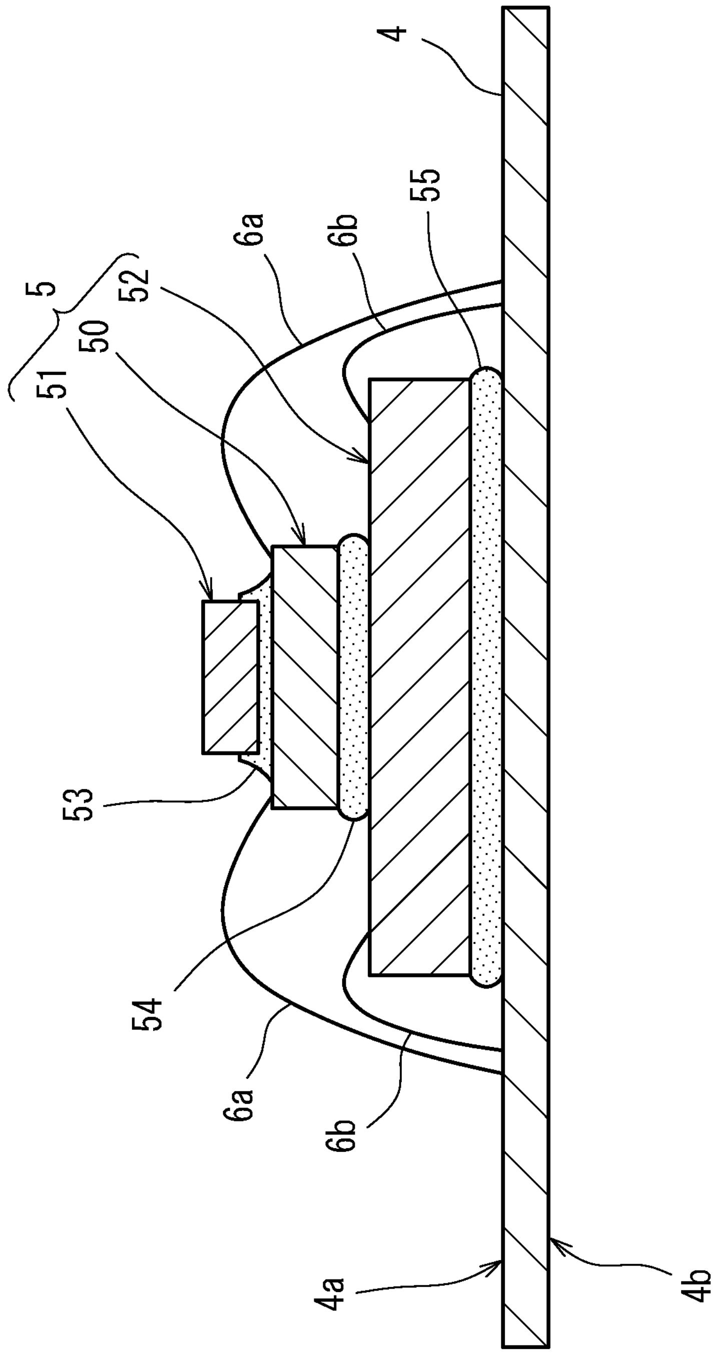
FIG. 2 is a cross-sectional view illustrating a schematic configuration of a core section and a core substrate of the OCXO of FIG. 1.
Figure 3:
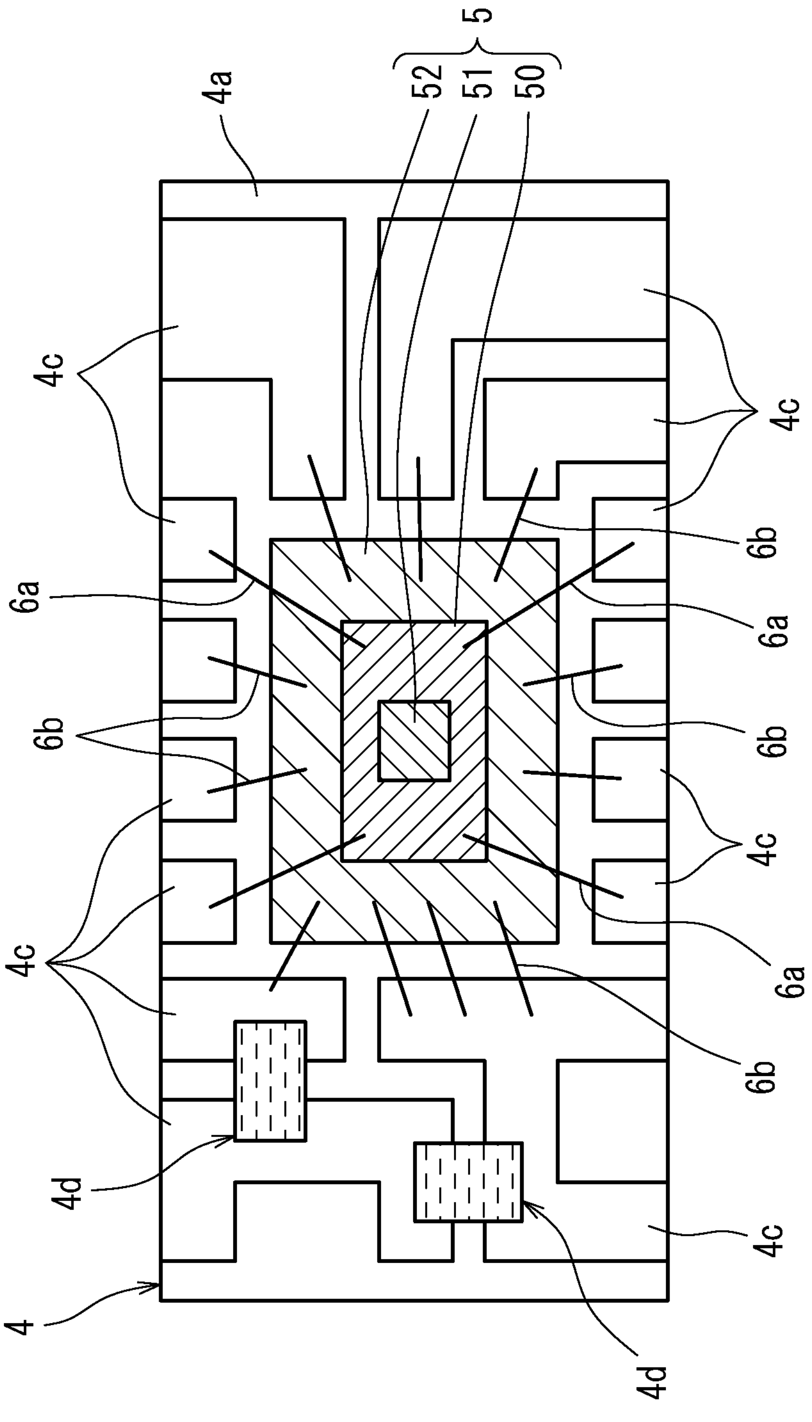
FIG. 3 is a plan view illustrating the core section and the core substrate of FIG. 2.

Here, the core section 5 is described referring to FIGS. 2 and 3. FIGS. 2 and 3 show the core section 5 mounted on the core substrate 4. The core section 5 packages various electronic components used for the OCXO 1, and has a three-layer structure (layered structure) in which an oscillation IC 51, a crystal resonator 50 and a heater IC 52 are laminated in this order from the uppermost layer side. The crystal resonator 50 having a three-ply structure is used to hermetically seal a vibrating part 11. The oscillation IC 51, the crystal resonator 50 and the heater IC 52 respectively have areas in plan view that become gradually smaller from the downside to the upside. The core section 5 stabilizes oscillation frequency of the OCXO 1 by adjusting the temperatures of the crystal resonator 50, the oscillation IC 51 and the heater IC 52. The electronic components of the core section 5 are not sealed by a sealing resin, however, depending on the sealing atmosphere, the electronic components may be sealed by the sealing resin.

A crystal oscillator 100 is constituted of the crystal resonator 50 and the oscillation IC 51. The oscillation IC 51 is mounted on the crystal resonator 50 via a plurality of metal bumps 51*a* (see FIG. 4). The oscillation frequency of the OCXO 1 is controlled by controlling the piezoelectric vibration of the crystal resonator 50 by the oscillation IC 51. The crystal oscillator 100 will be described later in detail.

Between the respective facing surfaces of the crystal resonator 50 and the oscillation IC 51, a non-conductive adhesive (underfill) 53 is interposed, which fixes the respective facing surfaces of the crystal resonator 50 and the oscillation IC 51 to each other. In this case, the front surface (a first main surface 201 of a first sealing member 20) of the crystal resonator 50 is bonded to the rear surface of the oscillation IC 51 via the non-conductive adhesive 53. As the non-conductive adhesive 53, a polyimide adhesive or an epoxy adhesive is, for example, used. Also, external terminals (electrode patterns 22 shown in FIG. 5) formed on the front surface of the crystal resonator 50 are connected to the connection terminals 4*c* formed on the front surface 4*a* of the core substrate 4, by wire bonding via the wires 6*a*.

The oscillation IC 51 has the area smaller than the area of the crystal resonator 50 in plan view. Thus, whole of the oscillation IC 51 is disposed within the area of the crystal resonator 50 in plan view. Also, whole of the rear surface of the oscillation IC 51 is bonded to the front surface (the first main surface 201 of the first sealing member 20) of the crystal resonator 50.

The heater IC 52 has a configuration in which a heating element (a heat source), a control circuit for controlling the temperature of the heating element (a current control circuit) and a temperature sensor for detecting the temperature of the heating element are integrally formed. By controlling the temperature of the core section 5 by the heater IC 52, it is possible to keep the temperature of the core section 5 substantially constant, which contributes to stabilization of the oscillation frequency of the OCXO 1.

Between the respective facing surfaces of the crystal resonator 50 and the heater IC 52, a non-conductive adhesive 54 is interposed, which fixes the respective facing surfaces of the crystal resonator 50 and the heater IC 52 to each other. In this case, the rear surface (a second main surface 302 of a second sealing member 30) of the crystal resonator 50 is bonded to the front surface of the heater IC 52 via the non-conductive adhesive 54. As the non-conductive adhesive 54, a polyimide adhesive or an epoxy adhesive is, for example, used. Also, external terminals (not shown) formed on the front surface of the heater IC 52 are connected to the connection terminals 4*c* formed on the front surface 4*a* of the core substrate 4, by wire bonding via the wires 6*b*.

The crystal resonator 50 has the area smaller than the area of the heater IC 52 in plan view. Thus, whole of the crystal resonator 50 is disposed within the area of the heater IC 52 in plan view. Also, whole of the rear surface of the crystal resonator 50 (the second main surface 302 of the second sealing member 30) is bonded to the front surface of the heater IC 52.

Between the respective facing surfaces of the heater IC 52 and the core substrate 4, a conductive adhesive 55 is interposed, which fixes the respective facing surfaces of the heater IC 52 and the core substrate 4 to each other. In this case, the rear surface of the heater IC 52 is bonded to the front surface 4*a* of the core substrate 4 via the conductive adhesive 55. Thus, the heater IC 52 is connected to ground via the conductive adhesive 55 and the core substrate 4. As the conductive adhesive 55, a polyimide adhesive or an epoxy adhesive is, for example, used. In the case where the heater IC 52 is connected to ground via wires or the like, a non-conductive adhesive such as the non-conductive adhesives 53 and 54 may be used in place of the conductive adhesive.

On the front surface 4*a* of the core substrate 4, various connection terminals 4*c* are formed as described above. Also, on the front surface 4*a* of the core substrate 4, a plurality of (in FIG. 3, two) chip capacitors (bypass capacitors) 4*d* is disposed. However, the size or the number of the chip capacitors 4*d* is not particularly limited.

Although the kind of the crystal resonator 50 used for the core section 5 is not particularly limited, a device having a sandwich structure is suitably used, which serves to make the device thinner. The device having the sandwich structure is constituted of: the first sealing member and the second sealing member both made of glass or crystal; and a piezoelectric resonator plate made of, for example, crystal. The piezoelectric resonator plate includes a vibrating part, on respective main surfaces of which excitation electrodes are formed. The first sealing member and the second sealing member are laminated and bonded via the piezoelectric resonator plate. Thus, in this three-ply structured device, the vibrating part of the piezoelectric resonator plate, which is disposed inside the device, is hermetically sealed.

The crystal oscillator 100 integrally formed by the sandwich-structured crystal resonator 50 and the oscillation IC 51 is described referring to FIGS. 4 to 10.

Figure 4:
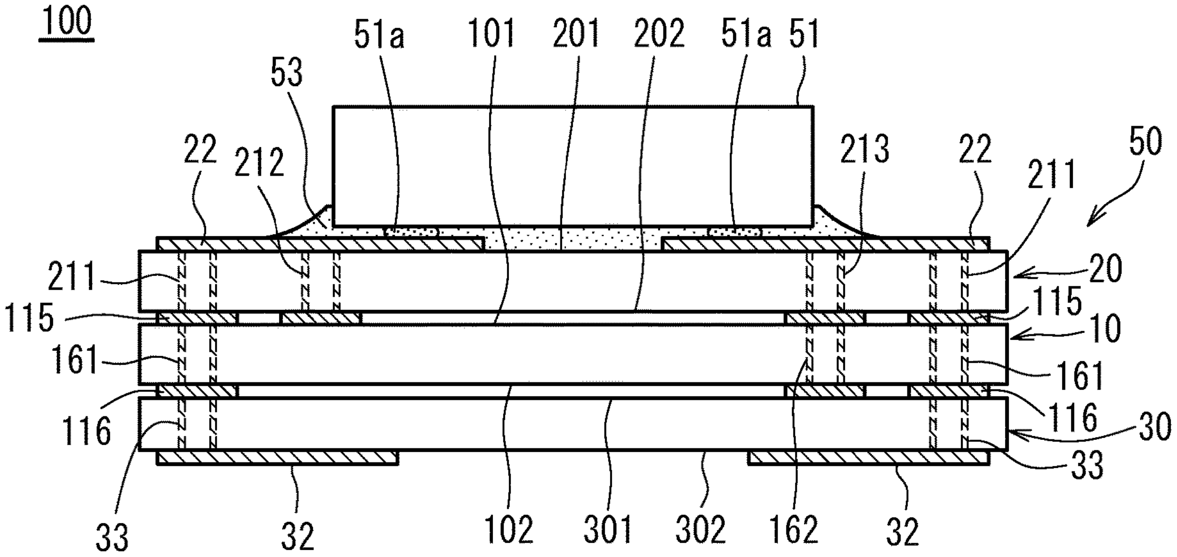
FIG. 4 is a schematic configuration diagram schematically illustrating a configuration of a crystal oscillator (a crystal resonator and an oscillation IC) of the core section of FIG. 2.

As shown in FIG. 4, the crystal oscillator 100 includes: a crystal resonator plate (piezoelectric resonator plate) 10; the first sealing member 20; the second sealing member 30; and the oscillation IC 51. In this crystal oscillator 100, the crystal resonator plate 10 is bonded to the first sealing member 20, and furthermore the crystal resonator plate 10 is bonded to the second sealing member 30. Thus, a package having a sandwich structure is formed so as to have a substantially rectangular parallelepiped shape. In the crystal oscillator 100, the first sealing member 20 and the second sealing member 30 are bonded to respective main surfaces of the crystal resonator plate 10, thus an internal space (cavity) of the package is formed. In this internal space, the vibrating part 11 (see FIGS. 7 and 8) is hermetically sealed.

The crystal oscillator 100 has, for example, a package size of 1.0×0.8 mm, which is reduced in size and height. According to the size reduction, no castellation is formed in the package. Through holes are used for conduction between electrodes. The oscillation IC 51 mounted on the first sealing member 20 is a one-chip integrated circuit element constituting, with the crystal resonator plate 10, an oscillation circuit. Also, the crystal oscillator 100 is mounted on the above-described heater IC 52 via the non-conductive adhesive 54.

Figure 7:
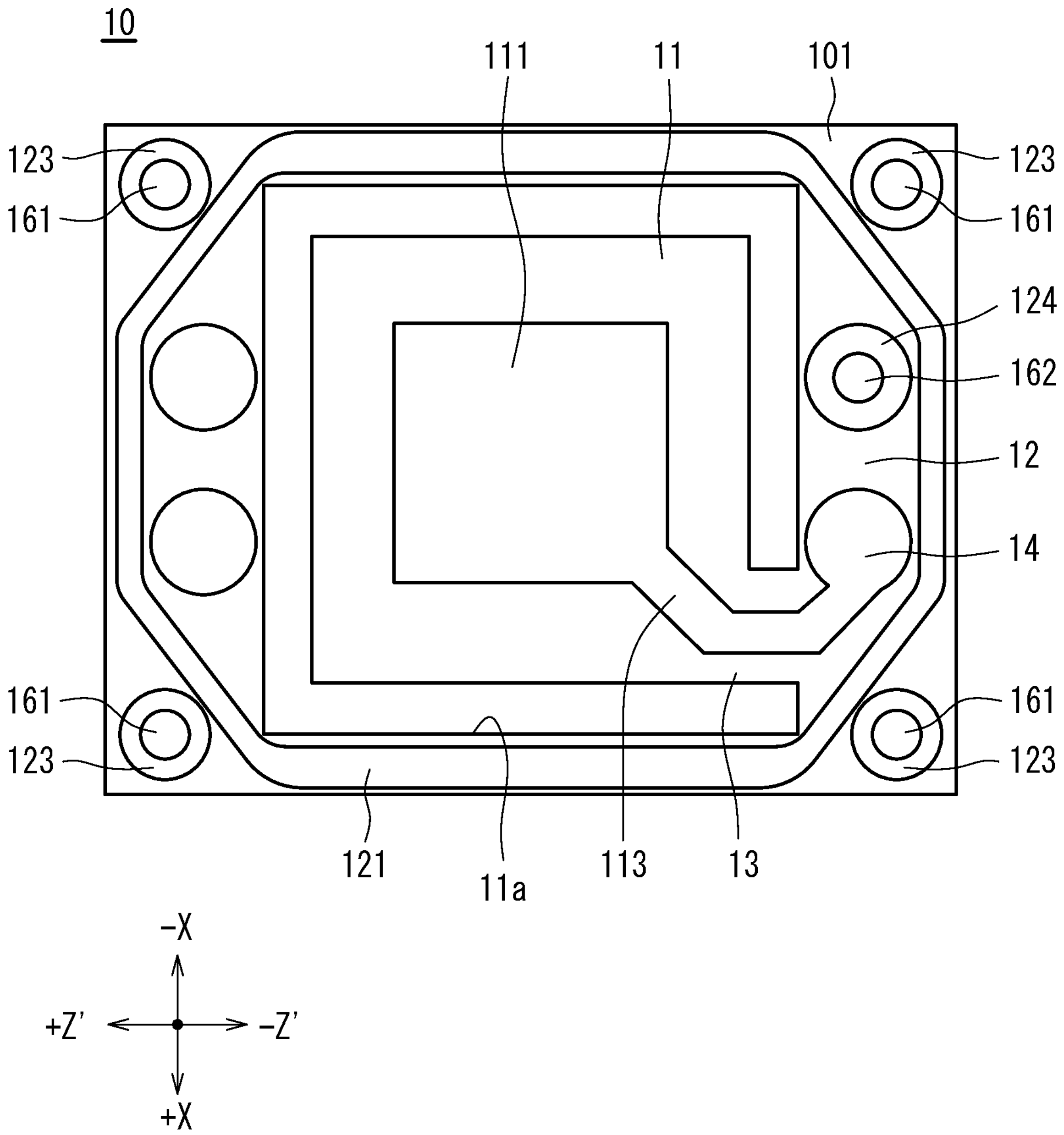
FIG. 7 is a schematic plan view illustrating a first main surface of a crystal resonator plate of the crystal oscillator of FIG. 4.
Figure 8:
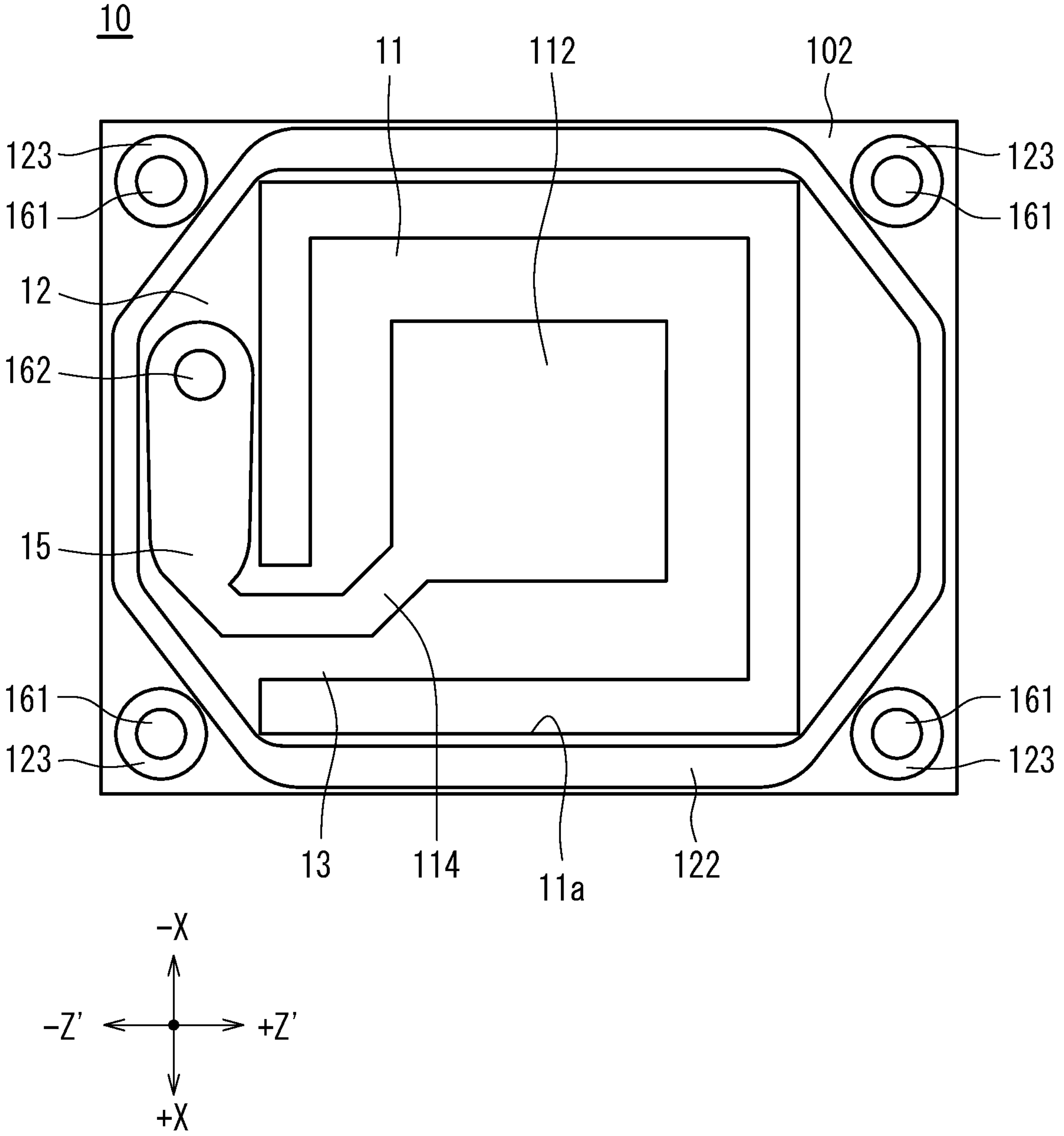
FIG. 8 is a schematic plan view illustrating a second main surface of the crystal resonator plate of the crystal oscillator of FIG. 4.

The crystal resonator plate 10 is a piezoelectric substrate made of crystal as shown in FIGS. 7 and 8. Each main surface (i.e. a first main surface 101 and a second main surface 102) is formed as a smooth flat surface (mirror-finished). An AT-cut crystal plate that causes thickness shear vibration is used as the crystal resonator plate 10. In the crystal resonator plate 10 shown in FIGS. 7 and 8, each main surface 101 and 102 of the crystal resonator plate 10 is an XZ' plane. On this XZ' plane, the direction parallel to the lateral direction (short side direction) of the crystal resonator plate 10 is the X axis direction, and the direction parallel to the longitudinal direction (long side direction) of the crystal resonator plate 10 is the Z' axis direction.

A pair of excitation electrodes (i.e. a first excitation electrode 111 and a second excitation electrode 112) is formed, respectively, on the main surfaces 101 and 102 of the crystal resonator plate 10. The crystal resonator plate 10 includes: the vibrating part 11 formed so as to have a substantially rectangular shape; an external frame part 12 surrounding the outer periphery of the vibrating part 11; and a support part (connection part) 13 that supports the vibrating part 11 by connecting the vibrating part 11 to the external frame part 12. That is, the crystal resonator plate 10 has a configuration in which the vibrating part 11, the external frame part 12 and the support part 13 are integrally formed. The support part 13 extends (protrudes) from only one corner part positioned in the +X direction and in the −Z' direction of the vibrating part 11 to the external frame part 12 in the −Z' direction. A penetrating part (slit) 11*a* is formed between the vibrating part 11 and the external frame part 12. The vibrating part 11 is connected to the external frame part 12 by only one support part 13.

The first excitation electrode 111 is provided on the first main surface 101 side of the vibrating part 11 while the second excitation electrode 112 is provided on the second main surface 102 side of the vibrating part 11. The first excitation electrode 111 and the second excitation electrode 112 are respectively connected to lead-out wirings (a first lead-out wiring 113 and a second lead-out wiring 114) so that these excitation electrodes are connected to external electrode terminals. The first lead-out wiring 113 is drawn from the first excitation electrode 111 and connected to a connection bonding pattern 14 formed on the external frame part 12 via the support part 13. The second lead-out wiring 114 is drawn from the second excitation electrode 112 and connected to a connection bonding pattern 15 formed on the external frame part 12 via the support part 13.

Resonator-plate-side sealing parts to bond the crystal resonator plate 10 respectively to the first sealing member 20 and the second sealing member 30 are provided on the respective main surfaces (i.e. the first main surface 101 and the second main surface 102) of the crystal resonator plate 10. As the resonator-plate-side sealing part on the first main surface 101, a resonator-plate-side first bonding pattern 121 is formed. As the resonator-plate-side sealing part on the second main surface 102, a resonator-plate-side second bonding pattern 122 is formed. The resonator-plate-side first bonding pattern 121 and the resonator-plate-side second bonding pattern 122 are each formed on the external frame part 12 so as to have an annular shape in plan view.

Also, as shown in FIGS. 7 and 8, five through holes are formed in the crystal resonator plate 10 so as to penetrate between the first main surface 101 and the second main surface 102. More specifically, four first through holes 161 are respectively disposed in the four corners (corner parts) of the external frame part 12. A second through hole 162 is disposed in the external frame part 12, on one side in the Z' axis direction relative to the vibrating part 11 (in FIGS. 7 and 8, on the side of the −Z' direction). Connection bonding patterns 123 are formed on the respective peripheries of the first through holes 161. Also, on the periphery of the second through hole 162, a connection bonding pattern 124 is formed on the first main surface 101 side while the connection bonding pattern 15 is formed on the second main surface 102 side.

In the first through holes 161 and the second through hole 162, through electrodes are respectively formed along a corresponding inner wall surface of the above through holes so as to establish conduction between the electrodes formed on the first main surface 101 and the second main surface 102.

Respective center parts of the first through holes 161 and the second through hole 162 are hollow penetrating parts penetrating between the first main surface 101 and the second main surface 102.

Figure 5:
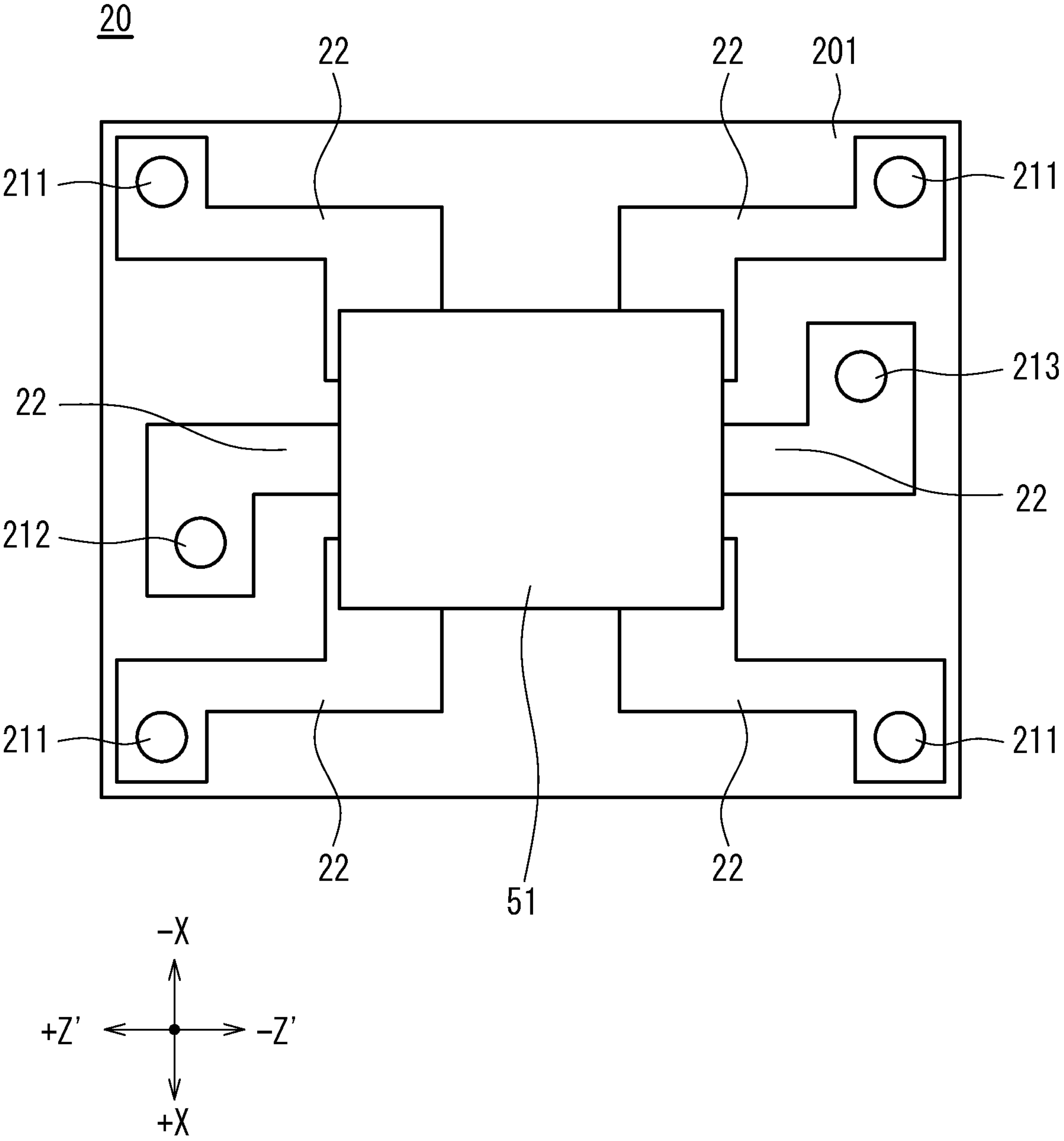
FIG. 5 is a schematic plan view illustrating a first main surface of a first sealing member of the crystal oscillator of FIG. 4.
Figure 6:
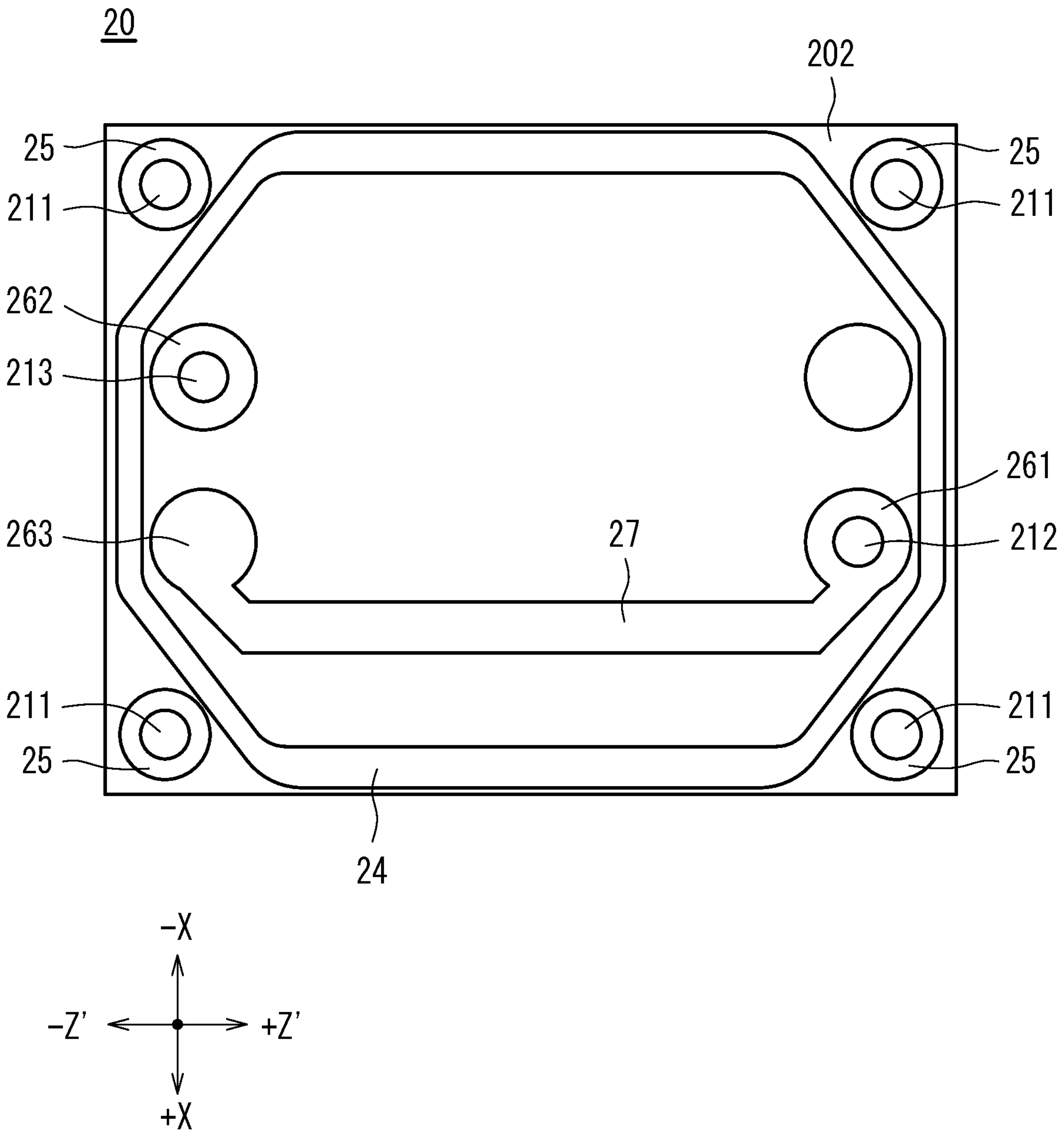
FIG. 6 is a schematic plan view illustrating a second main surface of the first sealing member of the crystal oscillator of FIG. 4.

As shown in FIGS. 5 and 6, the first sealing member 20 is a substrate having a rectangular parallelepiped shape that is made of a single AT-cut crystal plate. A second main surface 202 (a surface to be bonded to the crystal resonator plate 10) of the first sealing member 20 is formed as a smooth flat surface (mirror finished). By making the first sealing member 20, which does not have the vibrating part, of the AT-cut crystal plate as in the case of the crystal resonator plate 10, it is possible for the first sealing member 20 to have the same coefficient of thermal expansion as the crystal resonator plate 10. Thus, it is possible to prevent thermal deformation of the crystal oscillator 100. Furthermore, the respective directions of the X axis, Y axis and Z' axis of the first sealing member 20 are the same as those of the crystal resonator plate 10.

As shown in FIG. 5, on the first main surface 201 of the first sealing member 20, six electrode patterns 22 are formed, which include mounting pads for mounting the oscillation IC 51 as an oscillation circuit element. The oscillation IC 51 is bonded to the electrode patterns 22 by the flip chip bonding (FCB) method using the metal bumps (for example, Au bumps) 51*a* (see FIG. 4). Also in this embodiment, among the six electrode patterns 22, the electrode patterns 22 disposed in the four corners (corner parts) of the first main surface 201 of the first sealing member 20 are connected to the connection terminals 4*c* formed on the front surface 4*a* of the core substrate 4 as described above, via the wires 6*a*. In this way, the oscillation IC 51 is electrically connected to the outside via the wires 6*a*, the core substrate 4, the package 2 and the like.

As shown in FIGS. 5 and 6, six through holes are formed in the first sealing member 20 so as to be respectively connected to the six electrode patterns 22 and also to penetrate between the first main surface 201 and the second main surface 202. More specifically, four third through holes 211 are respectively disposed in the four corners (corner parts) of the first sealing member 20. Fourth and fifth through holes 212 and 213 are disposed respectively in the +Z' direction and in the −Z' direction in FIGS. 5 and 6.

In the third through holes 211 and the fourth and fifth through holes 212 and 213, through electrodes are respectively formed along a corresponding inner wall surface of the above through holes so as to establish conduction between the electrodes formed on the first main surface 201 and the second main surface 202. Respective center parts of the third through holes 211 and the fourth and fifth through holes 212 and 213 are hollow penetrating parts penetrating between the first main surface 201 and the second main surface 202.

On the second main surface 202 of the first sealing member 20, a sealing-member-side first bonding pattern 24 is formed as a sealing-member-side first sealing part so as to be bonded to the crystal resonator plate 10. The sealing-member-side first bonding pattern 24 is formed so as to have an annular shape in plan view.

On the second main surface 202 of the first sealing member 20, connection bonding patterns 25 are respectively formed on the peripheries of the third through holes 211. A connection bonding pattern 261 is formed on the periphery of the fourth through hole 212, and a connection bonding pattern 262 is formed on the periphery of the fifth through hole 213. Furthermore, a connection bonding pattern 263 is formed on the side opposite to the connection bonding pattern 261 in the long axis direction of the first sealing member 20 (i.e. on the side of the −Z' direction). The connection bonding pattern 261 and the connection bonding pattern 263 are connected to each other via a wiring pattern 27.

Figure 9:
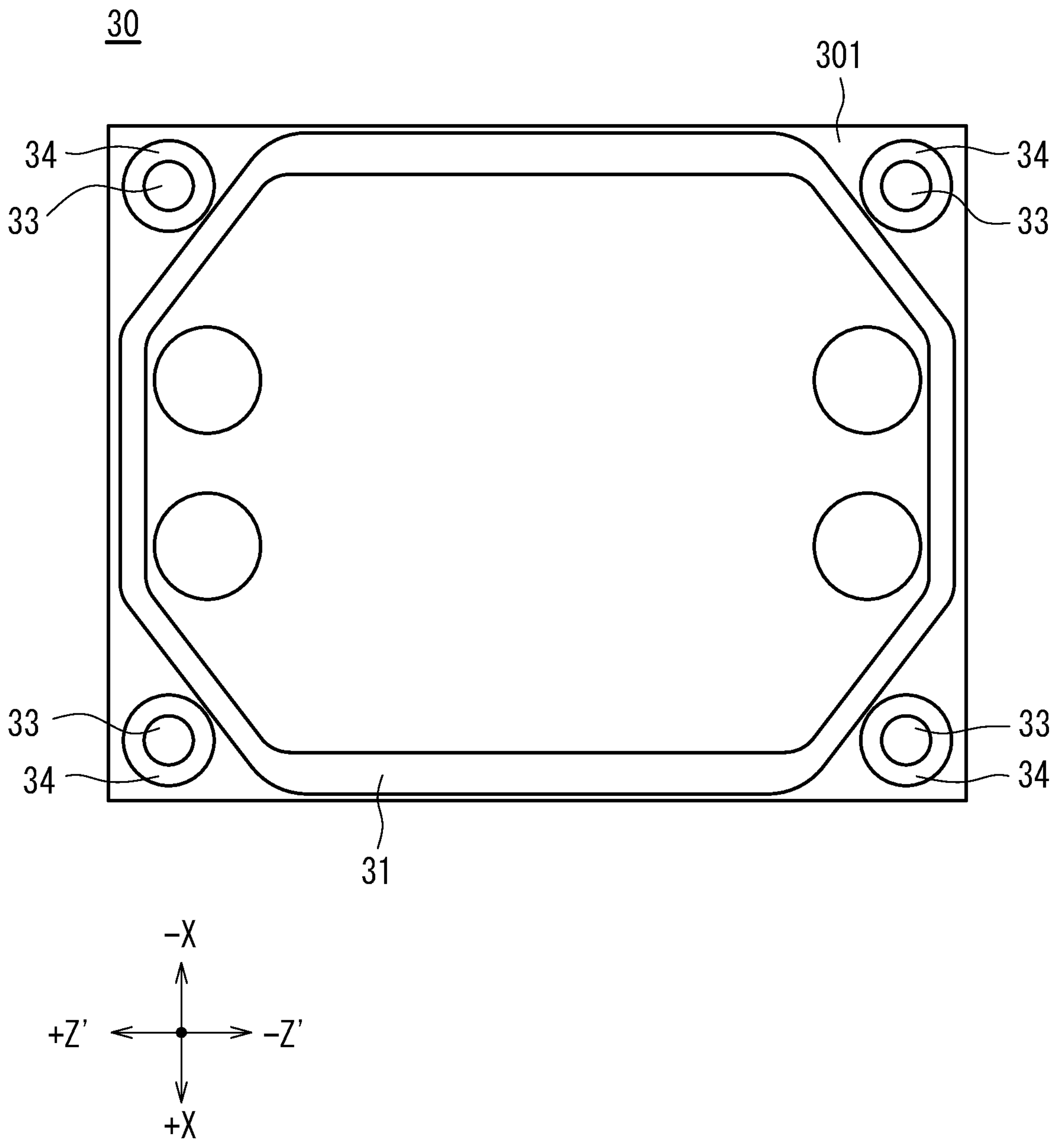
FIG. 9 is a schematic plan view illustrating a first main surface of a second sealing member of the crystal oscillator of FIG. 4.
Figure 10:
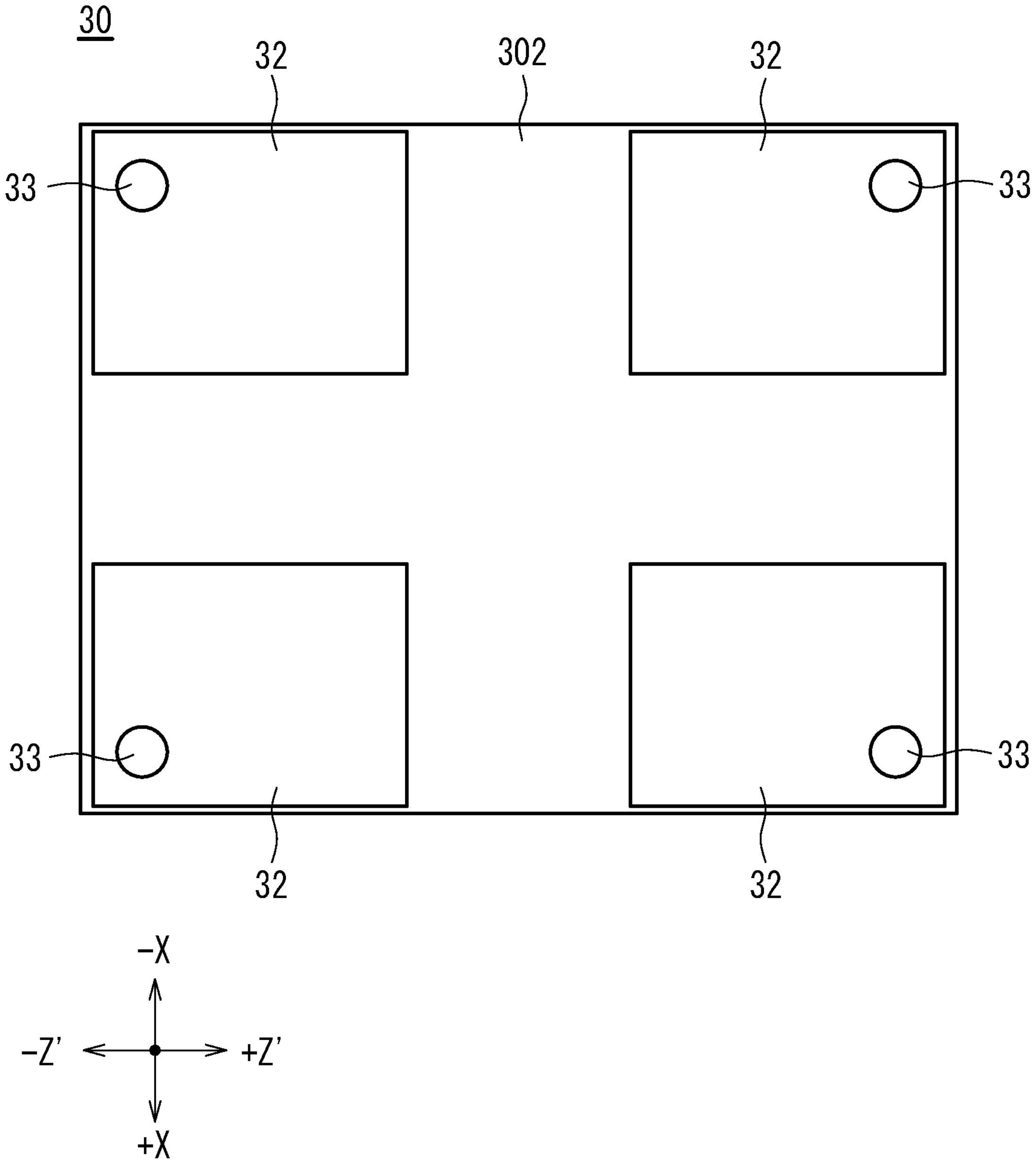
FIG. 10 is a schematic plan view illustrating a second main surface of the second sealing member of the crystal oscillator of FIG. 4.

As shown in FIGS. 9 and 10, the second sealing member 30 is a substrate having a rectangular parallelepiped shape that is made of a single AT-cut crystal plate. A first main surface 301 (a surface to be bonded to the crystal resonator plate 10) of the second sealing member 30 is formed as a smooth flat surface (mirror finished). The second sealing member 30 is also preferably made of an AT-cut crystal plate as in the case of the crystal resonator plate 10, and the respective directions of the X axis, Y axis and Z' axis of the second sealing member 30 are preferably the same as those of the crystal resonator plate 10.

On the first main surface 301 of the second sealing member 30, a sealing-member-side second bonding pattern 31 is formed as a sealing-member-side second sealing part so as to be bonded to the crystal resonator plate 10. The sealing-member-side second bonding pattern 31 is formed so as to have an annular shape in plan view.

On the second main surface 302 of the second sealing member 30, four electrode terminals 32 are formed. The electrode terminals 32 are respectively located on the four corners (corner parts) on the second main surface 302 of the second sealing member 30. In this embodiment, the electrical connection to the outside is carried out via the electrode patterns 22 and the wires 6*a* as described above. However, it is also possible to carry out the electrical connection to the outside via the electrode terminals 32.

As shown in FIGS. 9 and 10, four through holes are formed in the second sealing member 30 so as to penetrate between the first main surface 301 and the second main surface 302. More specifically, four sixth through holes 33 are respectively disposed in the four corners (corner parts) of the second sealing member 30. In the sixth through holes 33, through electrodes are respectively formed along a corresponding inner wall surface of the sixth through holes 33 so as to establish conduction between the electrodes formed on the first main surface 301 and the second main surface 302. In this way, the respective electrodes formed on the first main surface 301 are electrically conducted to the electrode terminals 32 formed on the second main surface 302 via the through electrodes formed along the inner wall surfaces of the sixth through holes 33. Also, respective central parts of the sixth through holes 33 are hollow penetrating parts penetrating between the first main surface 301 and the second main surface 302. On the first main surface 301 of the second sealing member 30, connection bonding patterns 34 are respectively formed on the peripheries of the sixth through holes 33. When the electrical connection to the outside is not carried out via the electrode terminals 32, it is not necessarily required to provide the electrode terminals 32, the sixth through holes 33 and the like.

In the crystal oscillator 100 including the crystal resonator plate 10, the first sealing member 20 and the second sealing member 30, the crystal resonator plate 10 and the first sealing member 20 are subjected to the diffusion bonding in a state in which the resonator-plate-side first bonding pattern 121 and the sealing-member-side first bonding pattern 24 are superimposed on each other, and the crystal resonator plate 10 and the second sealing member 30 are subjected to the diffusion bonding in a state in which the resonator-plate-side second bonding pattern 122 and the sealing-member-side second bonding pattern 31 are superimposed on each other, thus, the package having the sandwich structure as shown in FIG. 4 is produced. Accordingly, the internal space of the package, i.e. the space to house the vibrating part 11 is hermetically sealed.

In this case, the respective connection bonding patterns as described above are also subjected to the diffusion bonding in a state in which they are each superimposed on the corresponding connection bonding pattern. Such bonding between the connection bonding patterns allows electrical conduction of the first excitation electrode 111, the second excitation electrode 112, the oscillation IC 51 and the electrode terminals 32 of the crystal oscillator 100.

More specifically, the first excitation electrode 111 is connected to the oscillation IC 51 via the first lead-out wiring 113, the wiring pattern 27, the fourth through hole 212 and the electrode pattern 22 in this order. The second excitation electrode 112 is connected to the oscillation IC 51 via the second lead-out wiring 114, the second through hole 162, the fifth through hole 213 and the electrode pattern 22 in this order.

In the crystal oscillator 100, the bonding patterns are each preferably made of a plurality of layers laminated on the crystal plate, specifically, a Ti (titanium) layer and an Au (gold) layer deposited by the vapor deposition in this order from the lowermost layer side. Also, the other wirings and electrodes formed on the crystal oscillator 100 each preferably have the same configuration as the bonding patterns, which leads to patterning of the bonding patterns, the wirings and the electrodes at the same time.

In the above-described crystal oscillator 100, sealing parts (seal paths) 115 and 116 that hermetically seal the vibrating part 11 of the crystal resonator plate 10 are formed so as to have an annular shape in plan view. The seal path 115 is formed by the diffusion bonding of the resonator-plate-side first bonding pattern 121 and the sealing-member-side first bonding pattern 24 as described above. The outer edge and the inner edge of the seal path 115 both have a substantially octagonal shape. In the same way, the seal path 116 is formed by the diffusion bonding of the resonator-plate-side second bonding pattern 122 and the sealing-member-side second bonding pattern 31 as described above. The outer edge and the inner edge of the seal path 116 both have a substantially octagonal shape.

In the OCXO 1 having at least the core section 5 of this embodiment, the core section 5 includes: the three-ply structured crystal resonator 50 in which the vibrating part 11 is hermetically sealed; and the heater IC 52 as the heating element. Also, at least whole of the one main surface of the crystal resonator 50 is thermally coupled to the heater IC 52. In this case, whole of the second main surface 302 of the second sealing member 30 of the crystal resonator 50 has surface contact with the front surface of the heater IC 52 via the non-conductive adhesive 54 (second adhesive). In this way, since at least whole of the second main surface 302 of the second sealing member 30 of the three-ply structured crystal resonator 50 is thermally coupled to the heater IC 52, it is possible to efficiently heat the crystal resonator 50. Thus, it is possible to raise the temperature of the core section 5 rapidly to the target temperature, which reduces frequency fluctuation of the OCXO 1.

Also, the oscillation IC 51 is mounted on the crystal resonator 50, and whole of an active surface (rear surface in FIGS. 1 and 4) of the oscillation IC 51 is thermally coupled to the crystal resonator 50. In this case, the whole of the active surface of the oscillation IC 51 has surface contact with the first main surface 301 of the first sealing member 20 of the crystal resonator 50 via the non-conductive adhesive 53. In this way, it is possible to raise the temperature of the core section 5 including the oscillation IC 51, the crystal resonator 50, and the heater IC 52 rapidly to the target temperature.

Also in this embodiment, the heat capacity of the crystal resonator 50 is smaller than the heat capacity of the heater IC 52. Thus, it is possible to increase the temperature of the three-ply structured crystal resonator 50 rapidly and also to reduce the frequency fluctuation of the OCXO 1. Furthermore, the heat capacity of the oscillation IC 51 is smaller than the heat capacity of the heater IC 52. Thus, it is possible to raise the temperature of the core section 5 including the oscillation IC 51, the crystal resonator 50, and the heater IC 52 further rapidly to the target temperature. The heat capacity increases in the order of the oscillation IC 51, the crystal resonator 50, and the heater IC 52. Also the thickness increases in the order of the oscillation IC 51, the crystal resonator 50, and the heater IC 52. For example, the thickness of the oscillation IC 51 is 0.08 to 0.10 mm, the thickness of the crystal resonator 50 is 0.12 mm, and the thickness of the heater IC 52 is 0.28 to 0.30 mm.

Also in this embodiment, the three-layer structure (layered structure) is adopted, in which the oscillation IC 51, the crystal resonator 50 and the heater IC 52 are laminated in this order from the uppermost layer side. The heater IC 52 as the heating element has the largest heat capacity. Thus, it is possible to raise the temperature of the core section 5 including the oscillation IC 51, the crystal resonator 50, and the heater IC 52 further rapidly to the target temperature.

Furthermore, the bonding region of the crystal resonator 50 to the heater IC 52 in plan view is within the area of the front surface of the heater IC 52. Thus, it is possible to effectively conduct heat from the heater IC 52 to the crystal resonator 50, which leads to rapid increase of the temperature of the crystal resonator 50.

In this embodiment, the core section 5 is mounted inside the package 2 made of an insulating material, and is hermetically sealed by bonding the lid 3 to the package 2. In this case, the package 2 is made of ceramic such as alumina. In this way, by mounting the core section 5 inside the package 2 made of the insulating material and hermetically sealing it by the lid 3, the core section 5 is not exposed to the external environment. Thus, the core section 5 can be maintained at a constant temperature. Furthermore, since the core section 5 is fixed to the package 2 via the core substrate 4, stress from a mounting board on which the OCXO 1 is mounted is hardly transferred to the core section. Thus, it is possible to protect the core section 5.

Also in this embodiment, the core section 5 includes the core substrate 4 that is bonded to the heater IC 52 by a bonding material, and the core substrate 4 is made of an insulating material whose thermal conductivity is lower than that of the package 2. In this case, the core substrate 4 is made of crystal, glass or resin. In this way, since the core section 5 includes the core substrate 4 made of the insulating material having a thermal conductivity lower than that of the package 2, it is possible to prevent heat of the crystal resonator 50 heated by the heater IC 52 from being transferred to the package 2 made of ceramic such as alumina as the base material. As the core substrate 4, it is preferable to use a resin substrate having a heat resistance not less than 200° C. Examples of the material of the resin substrate include: polyimide; glass epoxy; epoxy; and super engineering plastics. Also, it is preferable that no wiring is formed on the surface of the core substrate 4.

Also in this embodiment, the core substrate 4 is bonded to the package 2 via the conductive adhesive 7 (first adhesive). In this way, by bonding the core substrate 4 made of crystal, glass or resin to the package 2 via the conductive adhesive 7, it is possible to prevent the heat of the core section 5 from being transferred to the package 2. In this case, the thermal conductivity of the non-conductive adhesive 54 (second adhesive) that is interposed between the respective facing surfaces of the crystal resonator 50 and the heater IC 52 is higher than the thermal conductivity of the conductive adhesive 7 (first adhesive) that is interposed between the respective facing surfaces of the core substrate 4 and the package 2. Since the thermal conductivity of the non-conductive adhesive 54 is higher than the thermal conductivity of the conductive adhesive 7, the heat from the heater IC 52 can be efficiently transferred to the crystal resonator 50 and the oscillation IC 51 on the crystal resonator 50 before it is transferred to the package 2. It is also preferable that the thermal conductivity of the non-conductive adhesive 54 that is interposed between the respective facing surfaces of the crystal resonator 50 and the heater IC 52 is higher than or substantially the same as the thermal conductivity of the conductive adhesive 55 that is interposed between the respective facing surfaces of the heater IC 52 and the core substrate 4.

In this embodiment, the crystal resonator 50 having the three-ply structure is used as the piezoelectric resonator of the core section 5, which hermetically seals the vibrating part 11 in the inside as described above and is capable of having a reduced height. Thus, it is possible to reduce the height and the size of the core section 5, and furthermore to reduce the heat capacity of the core section 5. The crystal resonator 50 has a thickness, for example, of 0.12 mm that is very thin compared to the conventional crystal resonators. Therefore, it is possible to remarkably reduce the heat capacity of the core section 5 compared to the conventional OCXOs, and thus to reduce the heater calorific value of the OCXO 1 including such a core section 5, which leads to low power consumption. Furthermore, the temperature followability of the core section 5 can be improved, which also improves the stability of the OCXO 1. In addition, in the crystal resonator 50 having the three-ply structure, the vibrating part 11 is hermetically sealed without using any adhesive, as described above. Thus, it is possible to prevent thermal convection by outgas generated by the adhesive from affecting. That is, when the adhesive is used, the thermal convection may be generated, in the space in which the vibrating part 11 is hermetically sealed, by circulation of outgas generated by the adhesive, which may prevent the temperature of the vibrating part 11 from being accurately adjusted. However, the three-ply structured crystal resonator 50 does not generate outgas. Thus, it is possible to accurately control the temperature of the vibrating part 11.

Also in the three-ply structured crystal resonator 50, the above-described seal paths 115 and 116 as well as the bonding materials formed by bonding the connection bonding patterns are constituted of thin metal film layers. Thus, the thermal conduction in the vertical direction (layered direction) of the crystal resonator 50 is improved, which leads to rapid homogenization of the temperature of the crystal resonator 50. In the case of the seal paths 115 and 116 and the like, the thickness of the thin metal film layers is not more than 1.00 mm (more specifically, 0.15 to 1.00 μm in the Au—Au bonding in this embodiment), which is much thinner than that in the conventional metal paste sealant containing Sn (for example, 5 to 20 μm). Thus, it is possible to improve the thermal conduction in the vertical direction (layered direction) of the crystal resonator 50. Also, since the crystal resonator plate 10 and the first sealing member 20 are bonded to each other by a plurality of bonding regions while the crystal resonator plate 10 and the second sealing member 30 are bonded to each other by a plurality of bonding regions, it is possible to further improve the thermal conduction in the vertical direction (layered direction) of the crystal resonator 50.

In this embodiment, the penetrating part 11*a* is formed between the vibrating part 11 and the external frame part 12 of the crystal resonator plate 10. The vibrating part 11 is connected to the external frame part 12 by only one support part 13. The support part 13 extends from only one corner part positioned in the +X direction and in the −Z' direction of the vibrating part 11 to the external frame part 12 in the −Z' direction. Thus, the support part 13 is provided on the corner part of the outer peripheral edge of the vibrating part 11, where the displacement of the piezoelectric vibration is relatively small. Thus, it is possible to prevent leak of the piezoelectric vibration to the external frame part 12 via the support part 13 compared to the case where the support part 13 is provided on a part other than the corner part (i.e. the middle part of the side), which contributes to further efficient piezoelectric vibration of the vibrating part 11. Also, it is possible to reduce stress that is applied to the vibrating part 11 compared to the case where two or more support parts 13 are provided. Thus, it is possible to improve the stability of the piezoelectric vibration by reducing frequency shift in the piezoelectric vibration due to the stress.

Furthermore, the electrode terminals 32 formed on the rear surface (the second main surface 302 of the second sealing member 30) of the crystal resonator 50 are electrically connected to the electrode patterns 22 formed on the front surface (the first main surface 201 of the first sealing member 20) of the crystal resonator 50. Thus, it is possible to conduct the heat from the heater IC 52 to the front surface of the crystal resonator 50 via the electrode terminals 32 on the rear surface of crystal resonator 50, which leads to rapid increase of the temperature of the crystal resonator 50.

The present invention may be embodied in other forms without departing from the gist or essential characteristics thereof. The foregoing embodiment is therefore to be considered in all respects as illustrative and not limiting. The scope of the invention is indicated by the appended claims rather than by the foregoing description, and all modifications and changes that come within the meaning and range of equivalency of the claims are intended to be embraced therein.

The three-ply structure of the crystal resonator 50 as described above is one example, and thus the structure may be variously changed. For example, the crystal resonator 50 may have an inverted mesa structure where the vibrating part 11 of the crystal resonator plate 10 is thinner than the external frame part 12. Also, the first sealing member 20 and the second sealing member 30 are not necessarily required to have a flat plate shape. They may have a side wall made of a thick outer-peripheral part.

The structure of the package 2 as described above is one example, and thus it may be variously changed. For example, the package may have an H-shaped cross section. In this case, the core section can be housed in one recess part of the package, and a chip capacitor (bypass capacitor) can be housed in the other recess part of the package.

In the above-described embodiment, the oscillation IC 51 is mounted on the crystal resonator 50 by the FCB method using the metal bumps. However, the present invention is not limited thereto. The oscillation IC 51 may be mounted on the crystal resonator 50 by wire bonding or by using the conductive adhesive. Also, the heater IC 52 is mounted on the core substrate 4 by wire bonding. However, the present invention is not limited thereto. The heater IC 52 may be mounted on the core substrate 4 by the FCB method using the metal bumps or by using the conductive adhesive. Also, the crystal resonator 50 is electrically connected to the core substrate 4 by wire bonding. However, the present invention is not limited thereto. The crystal resonator 50 may be electrically connected to the core substrate 4 via the heater IC 52 by mounting the crystal resonator 50 on the heater IC 52 by the FCB method using the metal bumps or by using the conductive adhesive.

In the above-described embodiment, the core section 5 has a structure in which the oscillation IC 51, the crystal resonator 50 and the heater IC 52 are laminated in this order from the uppermost layer side. Contrarily, the core section 5 may have a structure in which the heater IC 52, the crystal resonator 50 and the oscillation IC 51 are laminated in this order from the uppermost layer side.

In the core section 5 as described above, a heater substrate or the like may be added to the layered structure made of the oscillation IC 51, the crystal resonator 50, and the heater IC 52. For example, the core section 5 may have a four-layer structure in which the heater substrate, the oscillation IC 51, the crystal resonator 50 and the heater IC 52 are laminated in this order from the uppermost layer side, or also may have a four-layer structure in which the heater IC 52, the crystal resonator 50, the oscillation IC 51 and the heater substrate are laminated in this order from the uppermost layer side. In these cases, it is possible to further homogenize the temperature of the core section 5 by laminating the heater substrate as the heating element on the oscillation IC 51.

Figure 14:
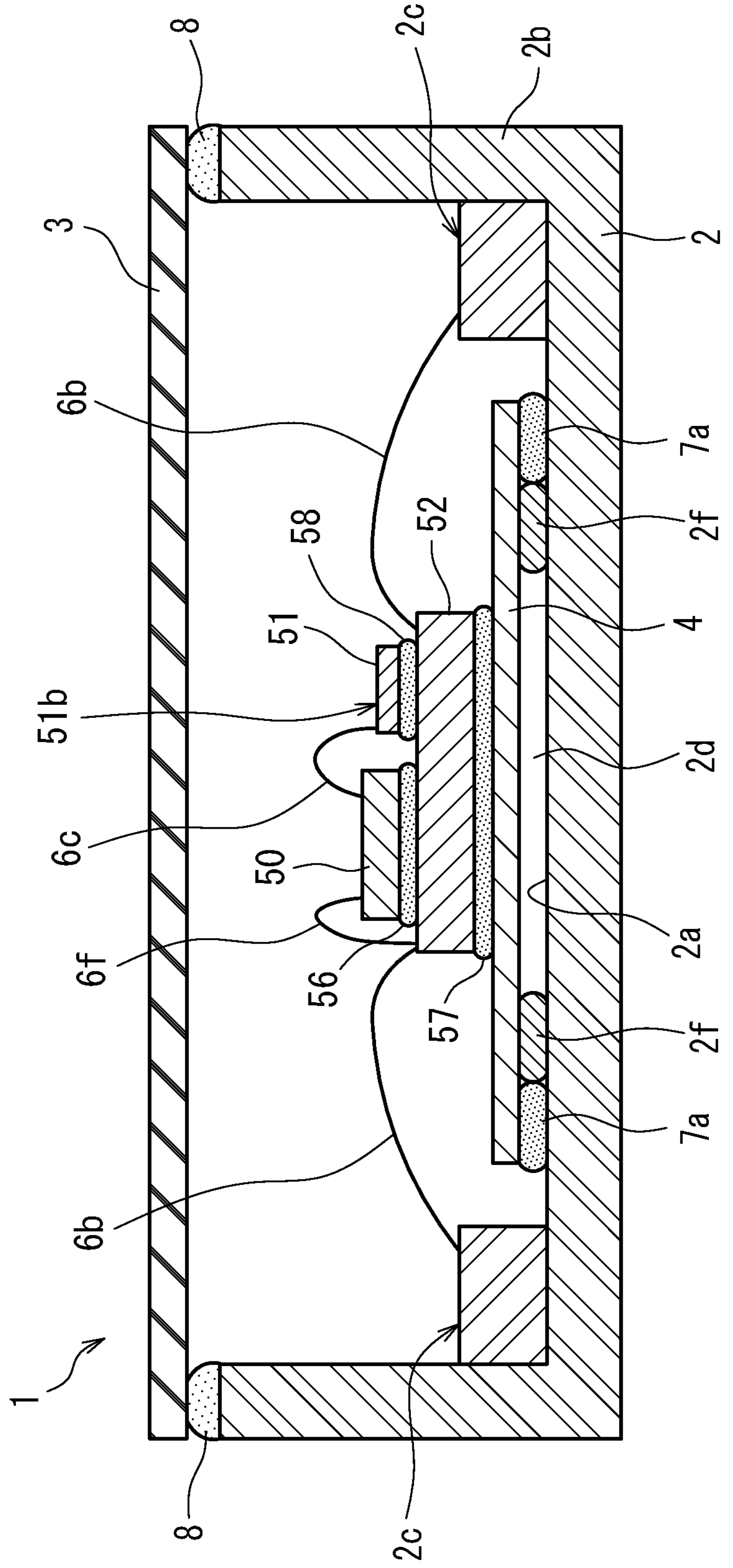
FIG. 14 is a cross-sectional view illustrating a schematic configuration of an OCXO according to variation 3.

In the above-described embodiment, the core section 5 has the three-layer structure where the oscillation IC 51, the crystal resonator 50 and the heater IC 52 are laminated. However, the present invention is not limited thereto. The core section 5 may have a structure where the crystal resonator 50 and the oscillation IC 51 are mounted side-by-side on the heater IC 52 (for example, see FIG. 14). In this case, whole of the second main surface 302 of the second sealing member 30 of the crystal resonator 50 has surface contact with the front surface of the heater IC 52 via the non-conductive adhesive. Also, whole of the active surface of the oscillation IC 51 may have surface contact with the front surface of the heater IC 52 via the non-conductive adhesive. When the crystal resonator 50 and the oscillation IC 51 are mounted side-by-side like this, the crystal resonator 50 and the oscillation IC 51 are electrically connected to each other by a wire as shown in FIG. 14.

In the above-described embodiment, the whole of the second main surface 302 of the second sealing member 30 of the crystal resonator 50 is thermally coupled to the heater IC 52. However, whole of the other main surface (the first main surface 201 of the first sealing member 20) of the crystal resonator 50 may also be thermally coupled to another heating element (for example, a heater substrate). As the other heating element in this case, it is possible to use a heater substrate in which a metal film is formed in a meandering manner on the surface of the crystal substrate. With this configuration, since the crystal resonator 50 can be efficiently heated from both main surface sides thereof, it is possible to further rapidly homogenize the temperature of the core section 5.

In the above-described embodiment, the crystal resonator plate 10 and the first and second sealing members 20 and 30 of the crystal resonator 50 are each made of an AT-cut crystal plate. However, in place of the AT-cut crystal plate, an SC-cut crystal plate may be used.

In the above-described embodiment, the conduction between the electrodes of the crystal resonator 50 is performed via the through holes. However, the conduction between the electrodes may be performed by castellations formed in wall surfaces of the inner walls and outer walls, or side walls of the package of the crystal resonator 50. This configuration may be beneficial when the package of the crystal resonator 50 is extremely minimized.

Figure 11:
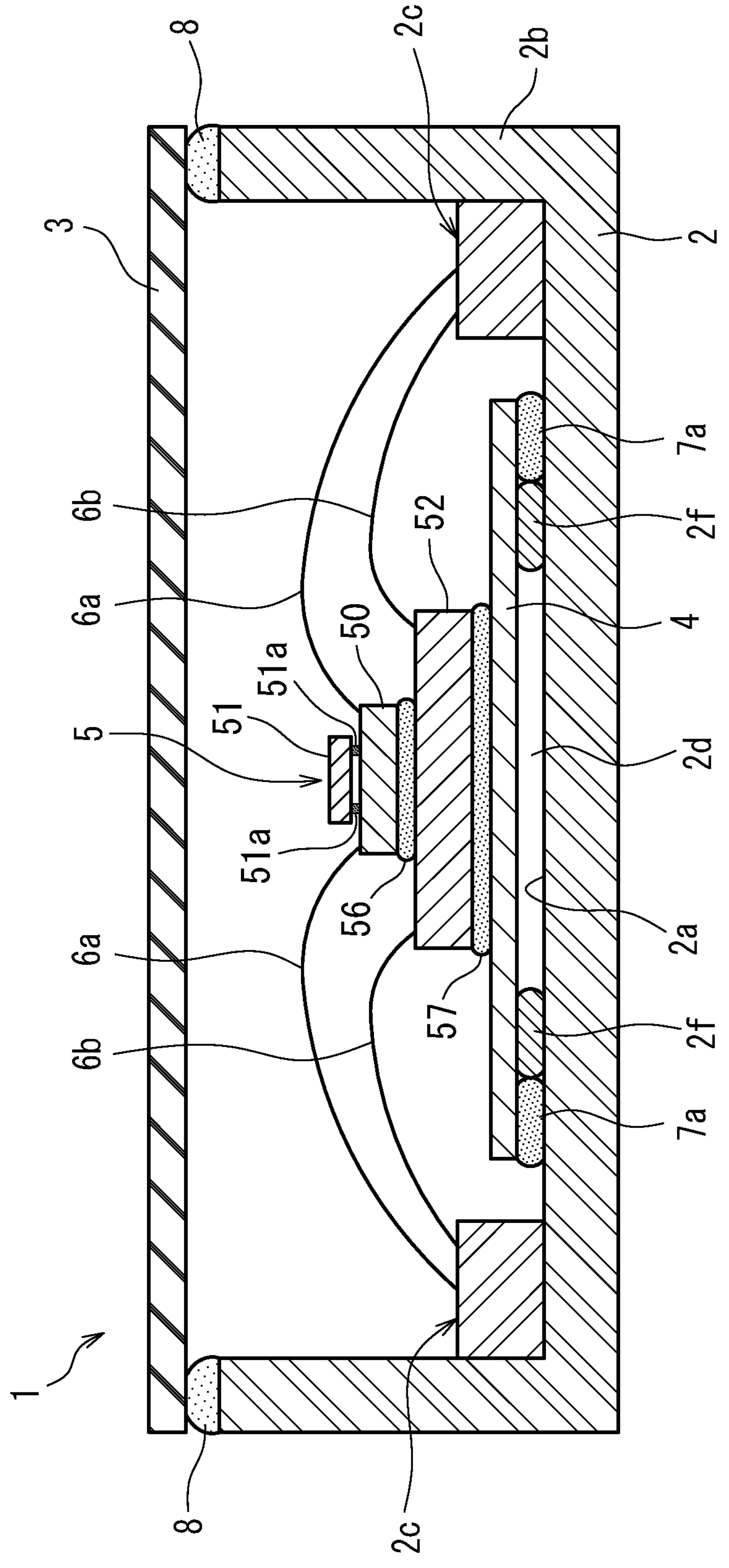
FIG. 11 is a cross-sectional view illustrating a schematic configuration of an OCXO according to variation 1.
Figure 12:
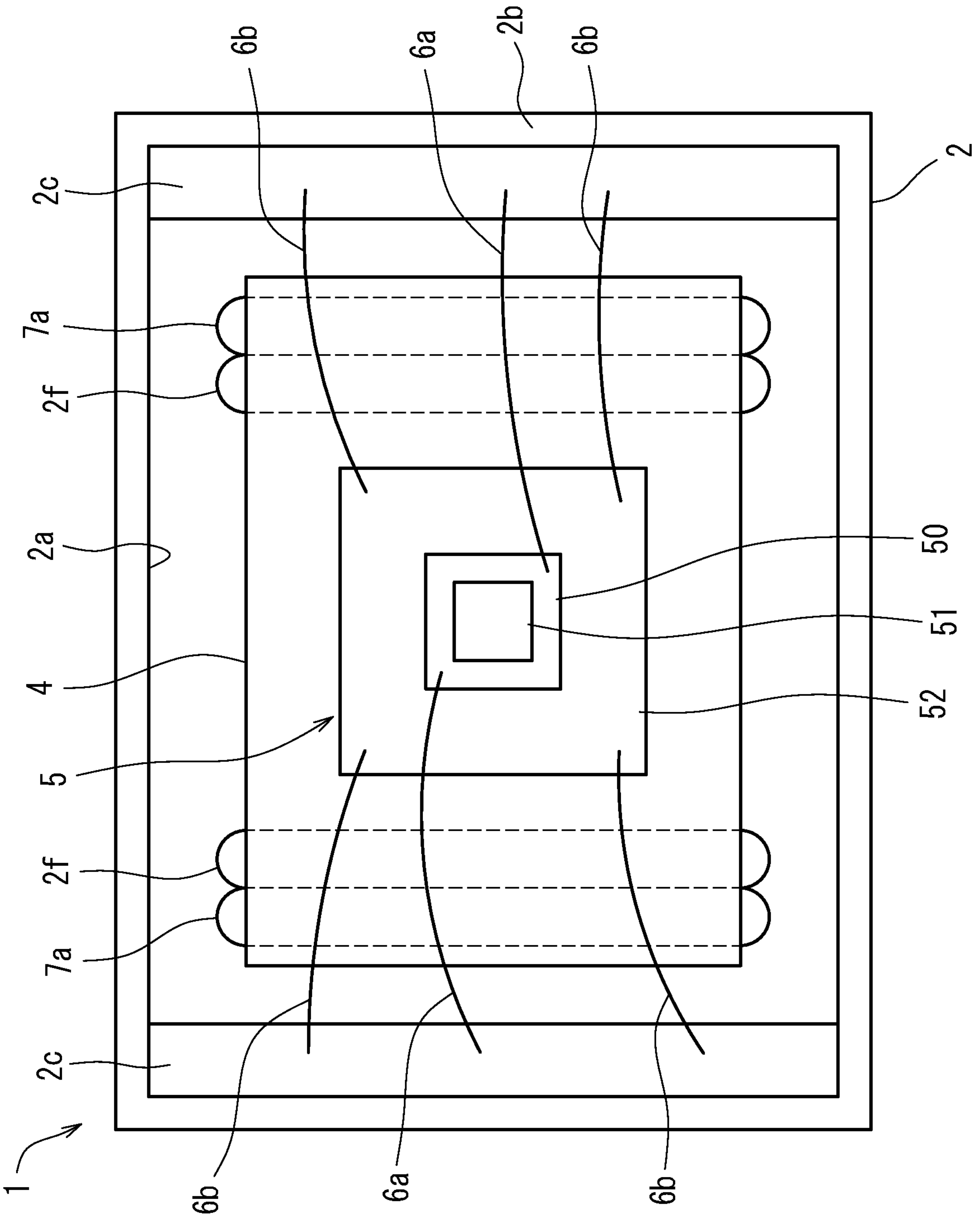
FIG. 12 is a plan view of the OCXO of FIG. 11.
Figure 13:
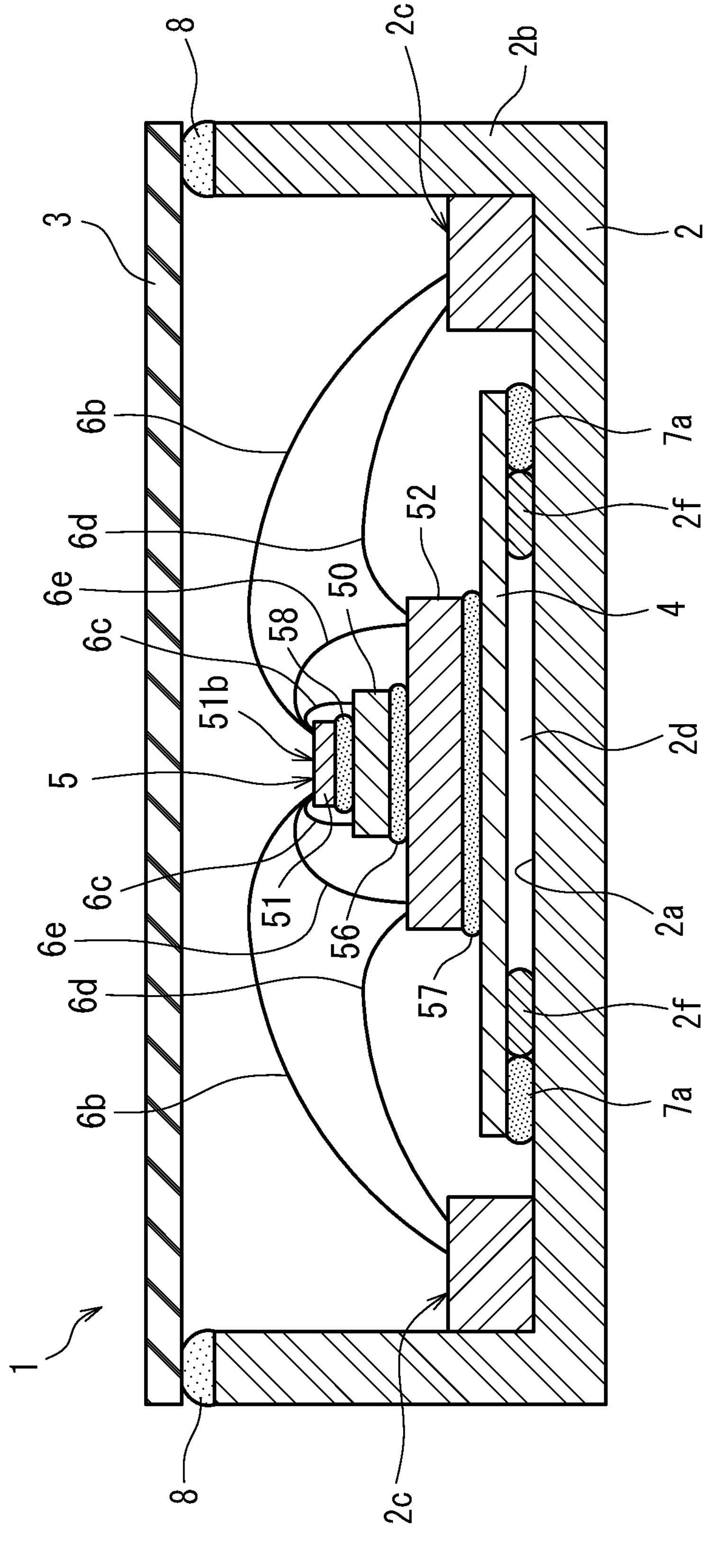
FIG. 13 is a cross-sectional view illustrating a schematic configuration of an OCXO according to variation 2.

In the above-described embodiment, the core section 5 is electrically connected to the package 2 via the core substrate 4. However, the core section 5 may be electrically connected to the package 2 not via the core substrate 4. That is, at least one of the oscillation IC 51, the crystal resonator 50 and the heater IC 52, which constitute the core section 5, may be electrically connected to the package 2 via wires. In the OCXO 1 according to this variation will be described referring to FIGS. 11 to 14. FIG. 11 is a cross-sectional view illustrating a schematic configuration of the OCXO 1 according to variation 1. FIG. 12 is a plan view of the OCXO 1 of FIG. 11. FIG. 13 is a cross-sectional view illustrating a schematic configuration of the OCXO 1 according to variation 2. FIG. 14 is a cross-sectional view illustrating a schematic configuration of the OCXO 1 according to variation 3.

A shown in FIGS. 11 and 12, the OCXO 1 according to variation 1 has a configuration in which the core section 5 is disposed in the package (housing) 2 made of ceramic or the like and having a substantially rectangular parallelepiped shape such that the core section 5 is hermetically sealed by the lid 3. The package 2 has, for example, a package size of 5.0×3.2 mm. The package 2 includes the recess part 2*a* whose upper part is opened, and the core section 5 is hermetically encapsulated in the recess part 2*a*. To the upper surface of the peripheral wall part 2*b* that surrounds the recess part 2*a*, the lid 3 is fixed by seam welding via the sealant 8. Thus, the inside of the package 2 is hermetically sealed (in the airtight state). As the sealant 8, a metal sealant such as Au—Sn alloy or solder is suitably used, however, other sealants including low melting point glass may also be used. However, the present invention is not limited thereto. The sealing may also be performed by seam welding with metal rings, direct seam welding without metal rings, or by beam welding. (However, note that the seam welding is preferred from the viewpoint of prevention of loss of vacuum). The space inside the package 2 is preferably in a vacuum state (for example, with the degree of vacuum not more than 10 Pa) or an atmosphere with low thermal conductivity with low pressure nitrogen or low pressure argon. FIG. 12 shows the OCXO 1 with the lid 3 being removed in order to indicate the internal configuration of the OCXO 1.

The step parts 2*c* are formed on the inner wall surface of the peripheral wall part 2*b* of the package 2 so as to be along the arrangement of the connection terminals (not shown). The core section 5 is disposed on the bottom surface of the recess part 2*a* (on the inner bottom surface of the package 2) between the facing pair of step parts 2*c* and 2*c* via the plate-like core substrate 4. Alternatively, the step parts 2*c* may be formed to surround the four sides of the bottom surface of the recess part 2*a*. The core substrate 4 is made of a resin material having heat resistance and flexibility such as polyimide. The core substrate 4 may be made of crystal.

The core substrate 4 is bonded to the bottom surface of the recess part 2*a* (i.e. to the inner bottom surface of the package 2) by a non-conductive adhesive 7*a*. The space 2*d* is formed under the core substrate 4. Also, the external terminals formed on the respective components of the core section 5 are connected to the connection terminals formed on the step surfaces of the step parts 2*c* by wire bonding via the wires 6*a* and 6*b*. One end of the wire 6*a* is connected to the electrode pattern 22 (see FIG. 5) formed on the first main surface 201 of the first sealing member 20 of the crystal resonator 50. One end of the wire 6*b* is connected to the external terminal (not shown) formed on the front surface of the heater IC 52. On the respective inner sides of the non-conductive adhesives 7*a* and 7*a*, spacer members 2*f* and 2*f* are provided.

The non-conductive adhesives 7*a* and 7*a* are disposed on both end parts of the core substrate 4 in the long-side direction so as to be straight lines extending in the short-side direction of the core substrate 4 (i.e. in the direction orthogonally intersecting the direction of the sheet on which FIG. 11 is illustrated). Each spacer member 2*f* is located side by side with the corresponding non-conductive adhesive 7*a* so as to be a straight line extending in the short-side direction of the core substrate 4. Thus, the respective spacer members 2*f* and 2*f* are interposed, each inside the corresponding non-conductive adhesive 7*a*, between the core substrate 4 and the inner bottom surface of the package 2. The both end parts of the core substrate 4 in the long-side direction are supported by the respective spacer members 2*f* and 2*f*.

The core substrate 4 is made of a resin material having heat resistance and flexibility such as polyimide. The spacer member 2*f* is made of a paste material such as molybdenum and tungsten. In this way, between the core substrate 4 and the inner bottom surface of the package 2, there are interposed substances such as the non-conductive adhesive 7*a* and the spacer member 2*f*. Thus, it is possible to easily ensure the space 2*d* between the core substrate 4 and the inner bottom surface of the package 2 by the interposed substances. Also, the thickness of the non-conductive adhesive 7*a* applied onto the inner bottom surface of the package 2 is defined by the spacer member 2*f*, which also results in easy definition of the width (height) of the space 2*d* between the core substrate 4 and the inner bottom surface of the package 2. The thickness of the spacer member 2*f* is preferably 5 to 50 μm. Also, no underfill is interposed between the respective facing surfaces of the crystal resonator 50 and the oscillation IC 51. The respective facing surfaces of the crystal resonator 50 and the oscillation IC 51 are fixed to each other by a plurality of metal bumps 51*a* so as to avoid influence by stress caused by the underfill. However, the underfill may be interposed between the respective facing surfaces of the crystal resonator 50 and the oscillation IC 51. Furthermore, a conductive adhesive 56 is interposed between the respective facing surfaces of the crystal resonator 50 and the heater IC 52. However, it may be the non-conductive adhesive that interposes between the respective facing surfaces of the crystal resonator 50 and the heater IC 52.

In the OCXO 1 according to variation 1, the whole of the second main surface 302 of the second sealing member 30 of the crystal resonator 50 is thermally coupled to the heater IC 52. In this case, the whole of the second main surface 302 of the second sealing member 30 of the crystal resonator 50 has surface contact with the front surface of the heater IC 52 via the conductive adhesive 56 (second adhesive). In this way, since at least whole of the second main surface 302 of the second sealing member 30 of the three-ply structured crystal resonator 50 is thermally coupled to the heater IC 52, it is possible to efficiently heat the crystal resonator 50. Thus, it is possible to raise the temperature of the core section 5 further rapidly to the target temperature, which also reduces frequency fluctuation of the OCXO 1.

The OCXO 1 according to variation 2 shown in FIG. 13 has substantially the same configuration as that in variation 1 shown in FIG. 11. However, the OCXO 1 in variation 2 differs from the OCXO 1 in variation 1 in that the crystal resonator 50 is electrically connected to the oscillation IC 51 by wire bonding.

Specifically, as shown in FIG. 13, the external terminals formed on the respective components of the core section 5 are connected to connection terminals formed on the step surfaces of the step parts 2*c* by wire bonding via wires 6*b* and 6*d*. One end of the wire 6*b* is connected to the external terminal (not shown) formed on the front surface of the heater IC 52. One end of the wire 6*d* is connected to the external terminal (not shown) formed on an active surface 51*b* of the oscillation IC 51. Unlike the above-described embodiment, in variation 2, the active surface 51*b* of the oscillation IC 51 is provided on the crystal resonator 50 so as to face upward.

Also in variation 2, the crystal resonator 50 and the oscillation IC 51 are electrically connected to each other by wires 6*c*. One end of the wire 6*c* is connected to the electrode pattern 22 (see FIG. 5) formed on the first main surface 201 of the first sealing member 20 of the crystal resonator 50. The other end of the wire 6*c* is connected to the electrode pattern (not shown) formed on the active surface 51*b* of the oscillation IC 51. Furthermore, the oscillation IC 51 and the heater IC 52 are electrically connected to each other by wires 6*e*. One end of the wire 6*e* is connected to the external terminal (not shown) formed on the active surface 51*b* of the oscillation IC 51. The other end of the wire 6*e* is connected to the external terminal (not shown) formed on the front surface of the heater IC 52.

A non-conductive adhesive 58 is interposed between the respective facing surfaces of the crystal resonator 50 and the oscillation IC 51. Whole of the surface opposite to the active surface 51*b* of the oscillation IC 51 has surface contact with the first main surface 201 of the first sealing member 20 of the crystal resonator 50 via the non-conductive adhesive 58. It may also be a conductive adhesive that is interposed between the respective facing surfaces of the crystal resonator 50 and the oscillation IC 51.

The OCXO 1 according to variation 3 shown in FIG. 14 has substantially the same configuration as that in variations 1 and 2 shown in FIGS. 11 and 13. However, the OCXO 1 in variation 3 differs from the OCXO 1 in variations 1 and 2 in that the crystal resonator 50 and the oscillation IC 51 are not layered on the heater IC 52 but mounted side-by-side on the heater IC 52.

Specifically, as shown in FIG. 14, the external terminals formed on the respective components of the core section 5 are connected to connection terminals formed on the step surfaces of the step parts 2*c* by wire bonding via wires 6*b*. One end of the wire 6*b* is connected to the external terminal (not shown) formed on the front surface of the heater IC 52.

Also in variation 3, the crystal resonator 50 and the oscillation IC 51 are electrically connected to each other by the wire 6*c*. One end of the wire 6*c* is connected to the electrode pattern 22 (see FIG. 5) formed on the first main surface 201 of the first sealing member 20 of the crystal resonator 50. The other end of the wire 6*c* is connected to the electrode pattern (not shown) formed on the active surface 51*b* of the oscillation IC 51. Furthermore, the crystal resonator 50 and the heater IC 52 are electrically connected to each other by a wire 6*f*. One end of the wire 6*f* is connected to the electrode pattern 22 (see FIG. 5) formed on the first main surface 201 of the first sealing member 20 of the crystal resonator 50. The other end of the wire 6*e* is connected to the external terminal (not shown) formed on the front surface of the heater IC 52.

Also in variation 3, the active surface 51*b* of the oscillation IC 51 is provided on the heater IC 52 so as to face upward. The non-conductive adhesive 58 is interposed between the respective facing surfaces of the heater IC 52 and the oscillation IC 51. Whole of the surface opposite to the active surface 51*b* of the oscillation IC 51 has surface contact with the front surface of the heater IC 52 via the non-conductive adhesive 58. It may also be a conductive adhesive that is interposed between the respective facing surfaces of the heater IC 52 and the oscillation IC 51.

In the above-described embodiment, the piezoelectric resonator device has a configuration in which the core section 5 is mounted inside the package 2.

However, the present invention can be applied to a piezoelectric resonator device in which the core section is not housed inside the package, provided that the piezoelectric resonator device includes at least the core section having the heating element and the three-ply structured piezoelectric resonator in which the vibrating part is hermetically sealed. Also in the above-described embodiment, the piezoelectric resonator device has a configuration in which the oscillation IC 51 is mounted on the crystal resonator 50. However, the present invention can be applied to a piezoelectric resonator device in which the oscillation IC is not mounted on the crystal resonator 50.

This application claims priority based on Patent Application No. 2021-002000 filed in Japan on Jan. 8, 2021. The entire contents thereof are hereby incorporated in this application by reference.

INDUSTRIAL APPLICABILITY

The present invention is suitably applied to a piezoelectric resonator device including a core section having a heating element and a three-ply structured piezoelectric resonator in which a vibrating part is hermetically sealed.

DESCRIPTION OF THE REFERENCE NUMERALS

1 OCXO (piezoelectric resonator device)
2 Package
4 Core substrate
5 Core section
11 Vibrating part
50 Crystal resonator (piezoelectric resonator)
52 Heater IC (heating element)

The invention claimed is:

1. A piezoelectric resonator device comprising at least a core section, wherein the core section includes: a three-ply structured piezoelectric resonator in which a vibrating part is hermetically sealed; and a heating element, and at least a whole of one main surface of the piezoelectric resonator is thermally coupled to the heating element, wherein the core section is mounted inside a package made of an insulating material, and is hermetically sealed in the package by bonding a lid to the package, the core section includes a substrate that is bonded to the heating element via a bonding material, and the substrate is made of an insulating material having a thermal conductivity lower than that of the package.

2. The piezoelectric resonator device according to claim 1, wherein an oscillation IC is mounted on the piezoelectric resonator, and a whole of an active surface of the oscillation IC is thermally coupled to the piezoelectric resonator or the heating element.

3. The piezoelectric resonator device according to claim 1, wherein a heat capacity of the piezoelectric resonator is smaller than a heat capacity of the heating element.

4. The piezoelectric resonator device according to claim 1, wherein the insulating material is crystal, glass, or resin.

5. The piezoelectric resonator device according to claim 4, wherein the substrate is bonded to the package via a first adhesive.

6. The piezoelectric resonator device according to claim 5, wherein the piezoelectric resonator and the heating element are bonded to each other via a second adhesive, and the second adhesive has a thermal conductivity higher than that of the first adhesive.

* * * * *